United States Patent
Kataoka et al.

(10) Patent No.: US 11,990,312 B2
(45) Date of Patent: May 21, 2024

(54) SPECIMEN MACHINING DEVICE AND SPECIMEN MACHINING METHOD

(71) Applicant: JEOL Ltd., Tokyo (JP)

(72) Inventors: Shogo Kataoka, Tokyo (JP); Koji Todoroki, Tokyo (JP)

(73) Assignee: JEOL Ltd., Tokyo (JP)

( * ) Notice: Subject to any disclaimer, the term of this patent is extended or adjusted under 35 U.S.C. 154(b) by 240 days.

(21) Appl. No.: 17/679,303

(22) Filed: Feb. 24, 2022

(65) Prior Publication Data

US 2022/0277925 A1    Sep. 1, 2022

(30) Foreign Application Priority Data

Feb. 26, 2021    (JP) ................. 2021-031185

(51) Int. Cl.
*H01J 37/20*    (2006.01)
*H01J 37/30*    (2006.01)

(52) U.S. Cl.
CPC .............. *H01J 37/20* (2013.01); *H01J 37/30* (2013.01); *H01J 2237/20214* (2013.01)

(58) Field of Classification Search
CPC .... H01J 37/20; H01J 37/3005; H01J 37/3056; H01J 2237/201; H01J 2237/202; H01J 2237/20207; H01J 2237/20214; H01J 2237/20221; H01J 2237/20242
See application file for complete search history.

(56) References Cited

U.S. PATENT DOCUMENTS

| 7,474,419 B2 | 1/2009 | Tappel et al. |
| 10,903,040 B2 | 1/2021 | Suzuki et al. |
| 2007/0125958 A1 * | 6/2007 | Tappel ............... H01L 21/68 250/441.11 |
| 2013/0134325 A1 | 5/2013 | Negishi |
| 2013/0220806 A1 | 8/2013 | Iwaya et al. |
| 2016/0093464 A1 | 3/2016 | Suzuki et al. |
| 2017/0069526 A1 | 3/2017 | Park et al. |
| 2018/0301318 A1 | 10/2018 | Iwaya et al. |
| 2018/0342369 A1 * | 11/2018 | Kataoka ............. C23C 14/5833 |

(Continued)

FOREIGN PATENT DOCUMENTS

| CN | 110476220 A | * 11/2019 | ............. H01J 37/20 |
| JP | 2013137995 A | 7/2013 | |

(Continued)

OTHER PUBLICATIONS

Office Action issued in JP2021031185 on Mar. 7, 2023.
Extended European Search Report issued in EP22157924.6 on Aug. 2, 2022.

*Primary Examiner* — David E Smith
*Assistant Examiner* — Hsien C Tsai
(74) *Attorney, Agent, or Firm* — The Webb Law Firm

(57) ABSTRACT

A specimen machining device includes an ion source which irradiates a specimen with an ion beam, a first rotating body (specimen holder) that holds the specimen and is rotatable about a first axis serving as a rotation axis, and a second rotating body on which the first rotating body is disposed and which is rotatable about a second axis serving as a rotation axis different from the first axis. The specimen machining device irradiates the specimen with the ion beam while moving the specimen by the rotation of the first rotating body and the rotation of the second rotating body.

19 Claims, 22 Drawing Sheets

(56) References Cited

U.S. PATENT DOCUMENTS

2019/0259569 A1\* 8/2019 Suzuki .................... H01J 37/20
2021/0151283 A1   5/2021 Suzuki et al.

FOREIGN PATENT DOCUMENTS

| JP | 2014139938 A | 7/2014 |
| JP | 201672089 A  | 5/2016 |
| JP | 2018200815 A | 12/2018 |
| JP | 202053406 A  | 4/2020 |

\* cited by examiner

SPECIMEN MACHINING DEVICE AND SPECIMEN MACHINING METHOD

CROSS-REFERENCE TO RELATED APPLICATION

This application claims priority to Japanese Patent Application No. 2021-031185 filed Feb. 26, 2021, the disclosure of which is hereby incorporated by reference in its entirety.

BACKGROUND OF THE INVENTION

Field of the Invention

The present invention relates to a specimen machining device and a specimen machining method.

Description of Related Art

As a specimen machining device for machining a specimen by using an ion beam, for example, a Cross Section Polisher (registered trademark) for machining a cross section of a specimen and an Ion Slicer (registered trademark) for preparing a thin-film specimen are known. By using a specimen machining device, for example, a specimen for an electron microscope can be prepared.

For example, JP-A-2018-200815 discloses an ion milling device including: a rotating mechanism that has a rotation shaft having the rotation center orthogonal to the optical axis of an ion beam and parallel to the direction of projection of a specimen from a masking shield, the rotating mechanism rotatably supporting a specimen stage; and a slide mechanism that supports the specimen held by the specimen holder so as to move the specimen along the direction of the optical axis of an ion beam. In the ion milling device according to JP-A-2018-200815, the specimen is moved along the direction of the optical axis of an ion beam by the slide mechanism, thereby increasing the machining width.

However, such a specimen processing device may cause machining streaks, which are marks of ion beam radiation, on the machining surface of a specimen.

SUMMARY OF THE INVENTION

According to the first aspect of the invention, there is provided a specimen machining device including:
- an ion source which irradiates a specimen with an ion beam;
- a first rotating body that holds the specimen and is rotatable about a first axis serving as a rotation axis; and
- a second rotating body on which the first rotating body is disposed and which is rotatable about a second axis serving as a rotation axis different from the first axis, the specimen being irradiated with the ion beam while being moved by a rotation of the first rotating body and a rotation of the second rotating body.

According to the second aspect of the invention, there is provided a specimen machining method in a specimen machining device that irradiates a specimen with an ion beam to machine the specimen, the method comprising:
- irradiating the specimen with the ion beam while moving the specimen by a rotation of a first rotating body that holds the specimen and rotates about a first axis serving as a rotation axis and a rotation of a second rotating body on which the first rotating body is disposed and which rotates about a second axis serving as a rotation axis different from the first axis.

DESCRIPTION OF THE INVENTION

According to an embodiment of the invention, there is provided a specimen machining device including:
an ion source which irradiates a specimen with an ion beam;
a first rotating body that holds the specimen and is rotatable about a first axis serving as a rotation axis; and
a second rotating body on which the first rotating body is disposed and which is rotatable about a second axis serving as a rotation axis different from the first axis,
the specimen being irradiated with the ion beam while being moved by a rotation of the first rotating body and a rotation of the second rotating body.

The specimen machining device configured thus can reduce machining streaks on a machining surface and extend the machining range of the specimen.

According to an embodiment of the invention, there is provided a specimen machining method in a specimen machining device that irradiates a specimen with an ion beam to machine the specimen, the method comprising:
irradiating the specimen with the ion beam while moving the specimen by a rotation of a first rotating body that holds the specimen and rotates about a first axis serving as a rotation axis and a rotation of a second rotating body on which the first rotating body is disposed and which rotates about a second axis serving as a rotation axis different from the first axis.

The specimen machining method can reduce machining streaks on a machining surface and extend the machining range of the specimen.

Preferred embodiments of the invention will be described below in detail below with reference to the drawings. It is noted that the following embodiments do not unduly limit the scope of the invention as stated in the claims. In addition, all of the components described in the following embodiments are not necessarily requirements of the invention.

1. First Embodiment 1.1. Configuration of Specimen Machining Device

Figure 1:
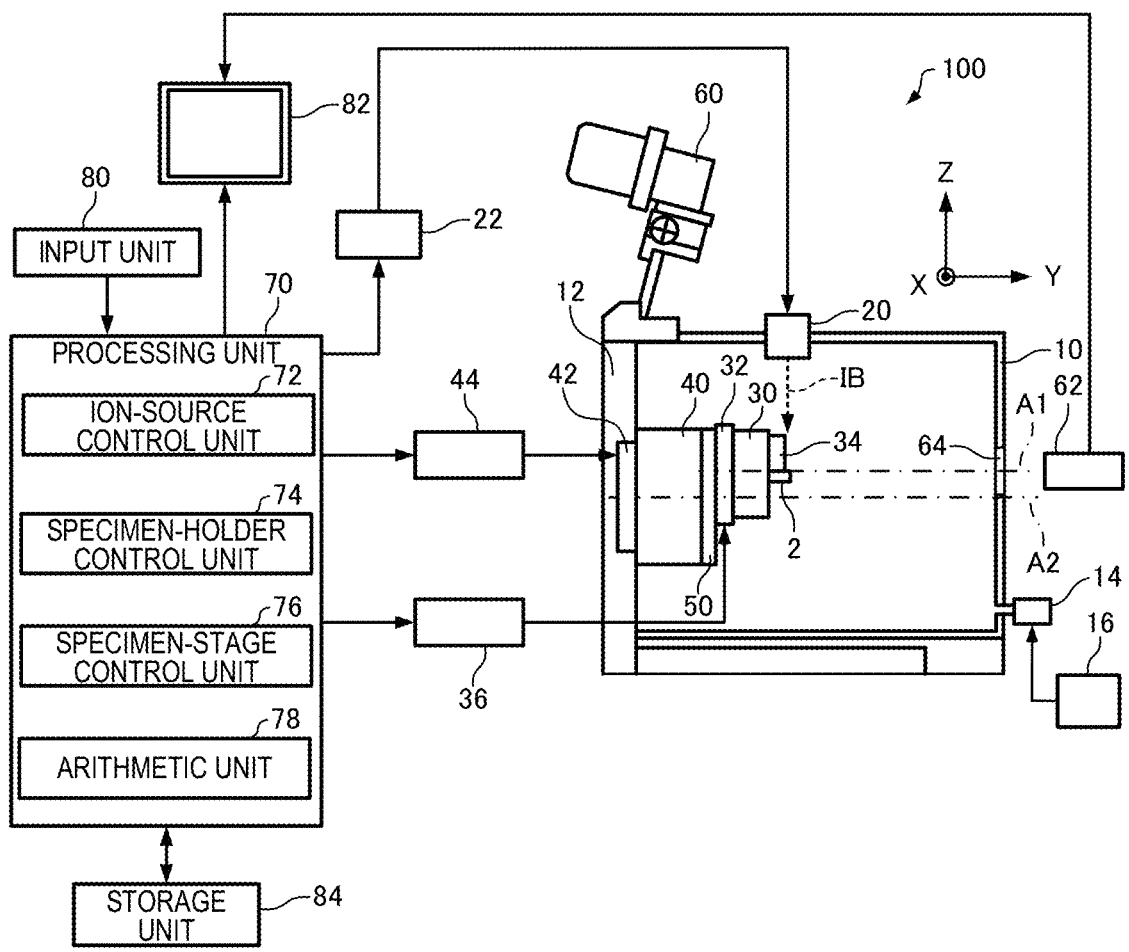
FIG. 1 illustrates a configuration of a specimen machining device according to the first embodiment.

A specimen machining device according to a first embodiment will be first described below with reference to the accompanying drawings. FIG. 1 illustrates the configuration of a specimen machining device 100 according to the first embodiment. FIG. 1 illustrates the X-axis, Y-axis, and Z-axis as three axes orthogonal to one another.

The specimen machining device 100 is an ion-beam machining device that irradiates a specimen 2 with an ion beam IB to machine the specimen 2 and prepares a specimen for observation and analysis. The specimen machining device 100 can machine, for example, a cross section of the specimen 2.

The specimen machining device 100 is used for preparing a specimen for an electron microscope, for example, a scanning electron microscope (SEM), a transmission electron microscope (TEM), or a scanning transmission electron microscope (STEM). Moreover, the specimen machining device 100 is used for preparing a specimen for, for example, an electron probe microanalyser (EPMA) or an Auger microprobe.

As illustrated in FIG. 1, the specimen machining device 100 includes a vacuum chamber 10, a specimen-stage drawing mechanism 12, an evacuation system 14, an evacuation control unit 16, an ion source 20, a specimen holder 30, a specimen-holder rotating mechanism 32, a specimen stage 40, a specimen-stage rotating mechanism 42, a slide mechanism 50, a positioning camera 60, a machining observation camera 62, a processing unit 70, an input unit 80, a display unit 82, and a storage unit 84.

The specimen stage 40 is disposed in the vacuum chamber 10. In the vacuum chamber 10, the specimen 2 is irradiated with the ion beam IB. The vacuum chamber 10 is evacuated by the evacuation system 14. The evacuation system 14 is controlled by the evacuation control unit 16.

The specimen-stage drawing mechanism 12 is a mechanism for drawing the specimen stage 40 from the vacuum chamber 10. The specimen-stage drawing mechanism 12 is attached to the vacuum chamber 10 so as to close the opening of the vacuum chamber 10. The specimen-stage drawing mechanism 12 can be opened and closed. The specimen stage 40 is attached to the specimen-stage drawing mechanism 12.

The ion source 20 irradiates the specimen 2 with the ion beam IB. The ion source 20 is attached to the top of the vacuum chamber 10. The ion source 20 is, for example, an ion gun. The ion source 20 emits the ion beam IB accelerated with a predetermined acceleration voltage. The ion source 20 emits the ion beam IB by ionizing, for example, Ar gas.

The ion beam IB has a diameter of, for example, about 1 to 2 mm. The ion source 20 emits the ion beam IB along the Z-axis. The optical axis (central axis) of the ion beam IB is parallel to the Z-axis. The ion source 20 may have a lens (electrode) for changing the diameter of the ion beam IB.

The specimen holder 30 is attached to the specimen stage 40 with the specimen-holder rotating mechanism 32 interposed therebetween. The specimen holder 30 is detachable from the specimen stage 40. The specimen holder 30 holds the specimen 2. The specimen holder 30 has a shield 34 attached thereto. The shield 34 is disposed on the specimen 2 and partially blocks the ion beam IB. In the specimen machining device 100, a projecting portion of the specimen 2 from the shield 34 is irradiated with the ion beam IB. Thus, a cross section of the specimen 2 can be machined.

The specimen holder 30 is a rotating body (first rotating body) that is rotated by the specimen-holder rotating mechanism 32. The specimen-holder rotating mechanism 32 rotates the specimen holder 30 about a first axis A1 serving as a rotation axis. The first axis A1 is orthogonal to the optical axis of the ion beam IB and is parallel to the direction of projection of the specimen 2 from the shield 34 (Y direction). The specimen 2 is rotated by rotating the specimen holder 30. The specimen-holder rotating mechanism 32 includes, for example, a motor for rotating the specimen holder 30.

The specimen stage 40 is attached to the specimen-stage drawing mechanism 12 with the specimen-stage rotating mechanism 42 interposed therebetween. On the specimen stage 40, the specimen holder 30 is disposed with the specimen-holder rotating mechanism 32 interposed between the specimen holder 30 and the specimen stage 40.

The specimen stage 40 is a rotating body (second rotating body) that is rotated by the specimen-stage rotating mechanism 42. The specimen holder 30 disposed on the specimen stage 40 is also rotated by rotating the specimen stage 40. The specimen-stage rotating mechanism 42 rotates the specimen stage 40 about a second axis A2 serving as a rotation axis. The specimen-stage rotating mechanism 42 includes, for example, a motor for rotating the specimen stage 40.

The first axis A1 serving as the rotation axis of the specimen holder 30 and the second axis A2 serving as the rotation axis of the specimen stage 40 are different axes. In other words, the specimen holder 30 and the specimen stage 40 do not rotate about the same rotation axis. In the illustrated example, the first axis A1 and the second axis A2 are parallel to each other. The first axis A1 and the second axis A2 are parallel to the Y-axis.

The slide mechanism 50 is disposed on the specimen stage 40. The slide mechanism 50 movably supports the specimen holder 30 along the Z-axis. The movement of the specimen holder 30 by the slide mechanism 50 can change a distance between the first axis A1 and the second axis A2 (hereinafter also referred to as "center distance").

The slide mechanism 50 includes a rail disposed on the specimen stage 40 and a holder support part having a slide groove slidably engaged with the rail. The rail and holder support part are not illustrated. The holder support part is attached to the specimen holder 30. The holder support part has a retention hole. The specimen holder 30 is secured with a retention screw fixed in the retention hole.

The positioning camera 60 is attached to the upper end of the specimen-stage drawing mechanism 12. The positioning camera 60 is, for example, a camera attached to an optical microscope.

Figure 2:
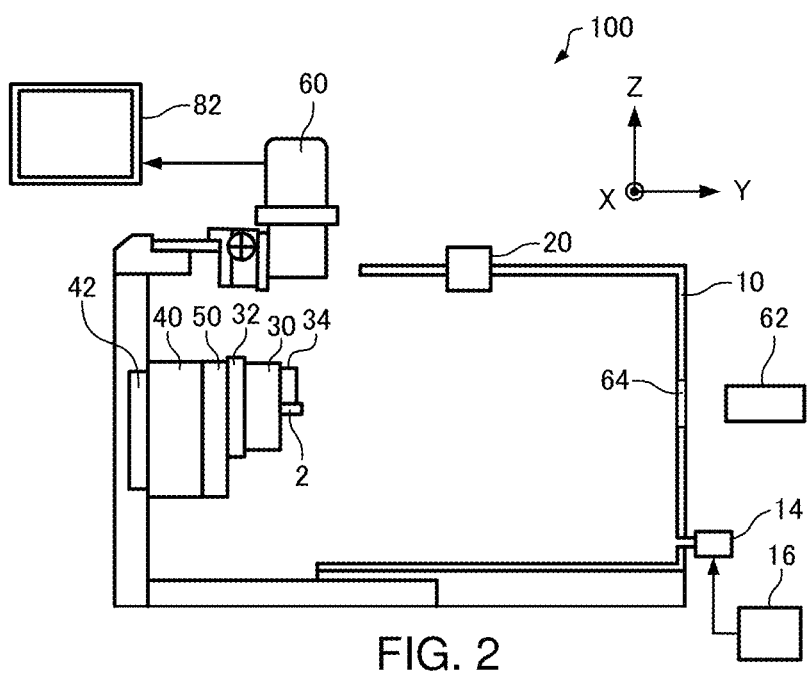
FIG. 2 illustrates an operation of a specimen-stage drawing mechanism.

FIG. 2 illustrates an operation of the specimen-stage drawing mechanism 12. In FIG. 2, the specimen-stage drawing mechanism 12 is opened. For convenience, the illustration of the processing unit 70, the input unit 80, and the storage unit 84 is omitted in FIG. 2.

An image captured by the positioning camera 60 is displayed on the display unit 82. For example, when the target machining position of the specimen 2 is adjusted to the center of the field of view of the positioning camera 60 while the specimen-stage drawing mechanism 12 is opened as illustrated in FIG. 2, the target machining position is irradiated with the ion beam IB that is to be emitted from the ion source 20 while the specimen-stage drawing mechanism 12 is closed as illustrated in FIG. 1. In this way, in the specimen machining device 100, the target machining position of the specimen 2 can be irradiated with the ion beam IB by adjusting the position of the specimen 2 by using the positioning camera 60.

The machining observation camera 62 is disposed outside the vacuum chamber 10. The machining observation camera 62 can observe the inside of the vacuum chamber 10 through an observation window 64 provided on the vacuum chamber 10. The optical axis of the machining observation camera 62 is parallel to the Y-axis. The optical axis of the machining observation camera 62 is aligned with, for example, the first axis A1. An image captured by the machining observation camera 62 is displayed on the display unit 82.

The input unit 80 is provided for a user input of operation information. The inputted operation information is outputted to the processing unit 70. The functions of the input unit 80 can be implemented by input devices such as a keyboard, a mouse, a button, and a touch panel.

The display unit 82 displays an image generated by the processing unit 70. The functions of the display unit 82 can be implemented by, for example, an LCD, a CRT, and a touch panel also acting as the input unit 80.

The storage unit 84 stores programs and various kinds of data that are provided for causing a computer to act as the units of the processing unit 70. The storage unit 84 also acts as a work area of the processing unit 70. The functions of the storage unit 84 can be implemented by, for example, a hard disk and random access memory (RAM).

The functions of the processing unit 70 can be implemented by executing programs by means of hardware including various processors (e.g., a CPU and a DSP). The processing unit 70 includes an ion-source control unit 72, a specimen-holder control unit 74, and a specimen-stage control unit 76.

The ion-source control unit 72 controls the ion source 20. The ion-source control unit 72 generates a control signal for controlling the ion source 20 and outputs the control signal to an ion-source control circuit 22. The ion-source control circuit 22 converts the control signal into a driving signal for driving the ion source 20 and outputs the driving signal to the ion source 20.

The specimen-holder control unit 74 controls the rotation of the specimen holder 30. The specimen-holder control unit 74 controls the rotation speed (rotation period) and rotation direction of the specimen holder 30. The specimen-holder control unit 74 controls the specimen-holder rotating mechanism 32 to rotate the specimen holder 30.

The specimen-holder control unit 74 generates a control signal for controlling the specimen-holder rotating mechanism 32 and outputs the control signal to a specimen-holder control circuit 36. The specimen-holder control circuit 36 converts the control signal into a driving signal for driving the specimen-holder rotating mechanism 32 and outputs the driving signal to the specimen-holder rotating mechanism 32.

The specimen-stage control unit 76 controls the rotation of the specimen stage 40. The specimen-stage control unit 76 controls the rotation speed (rotation period) and the rotation direction of the specimen stage 40. The specimen-stage control unit 76 controls the specimen-stage rotating mechanism 42 to rotate the specimen stage 40.

The specimen-stage control unit 76 generates a control signal for controlling the specimen-stage rotating mechanism 42 and outputs the control signal to a specimen-stage control circuit 44. The specimen-stage control circuit 44 converts the control signal into a driving signal for driving the specimen-stage rotating mechanism 42 and outputs the driving signal to the specimen-stage rotating mechanism 42.

An arithmetic unit 78 performs, for example, processing for calculating a distance between the first axis A1 and the second axis A2 based on information about a machining width and processing for calculating the range of the tilt angle of the specimen 2 based on the information about a machining width.

The processing of the units of the processing unit 70 will be specifically described later.

1.2. Operation of Specimen Machining Device

1.2.1. Basic Operation of Specimen Machining Device

In the specimen machining device 100, the specimen 2 is irradiated with the ion beam IB and is machined while moving the specimen 2 by the rotation of the specimen holder 30 and the rotation of the specimen stage 40.

Figure 3:
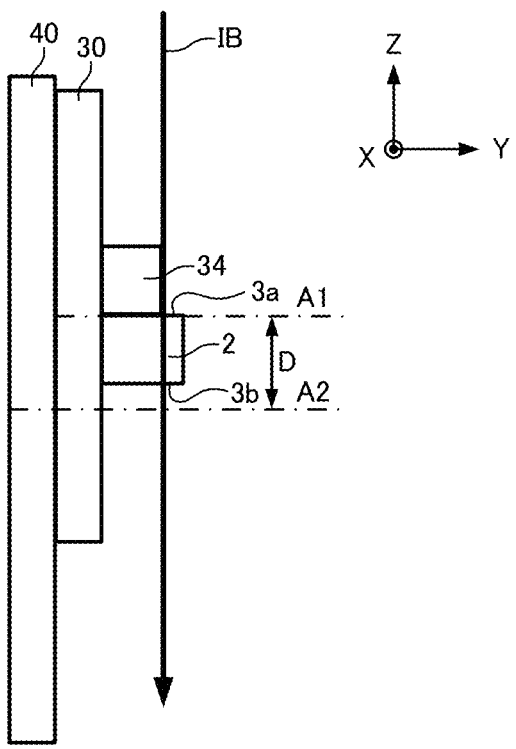
FIG. 3 schematically illustrates a specimen set on a specimen holder.
Figure 4:
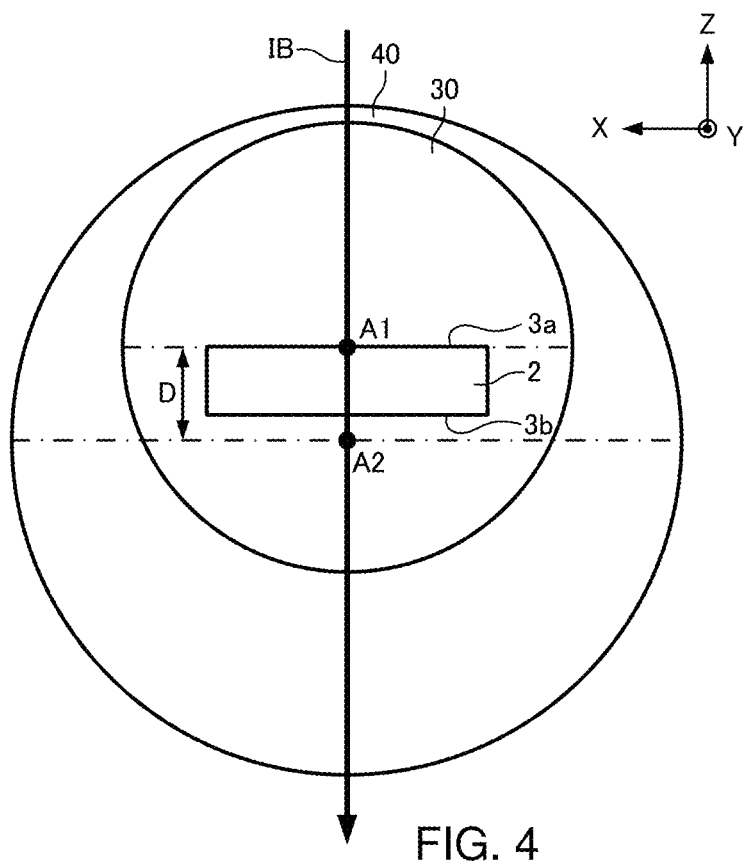
FIG. 4 schematically illustrates a specimen set on a specimen holder.

FIGS. 3 and 4 schematically illustrate the specimen 2 set on the specimen holder 30. For convenience, FIG. 3 only illustrates the shield 34, the specimen holder 30, and the specimen stage 40, and FIG. 4 only illustrates the specimen holder 30 and the specimen stage 40.

The specimen 2 has a first surface 3a and a second surface 3b on the opposite side from the first surface 3a. As illustrated in FIGS. 3 and 4, the specimen 2 is disposed with the first surface 3a facing upward (+Z direction) and the second surface 3b facing downward (−Z direction). The specimen 2 is disposed with the first surface 3a located on the first axis A1. The shield 34 is disposed on the first surface 3a, and the first axis A1 passes the boundary between the first surface 3a and the shield 34. The ion beam IB is emitted from the first surface 3a of the specimen 2.

The specimen holder 30 is positioned by the slide mechanism 50 such that the first axis A1 is located at a different position from the second axis A2 in Z direction.

Figure 5:
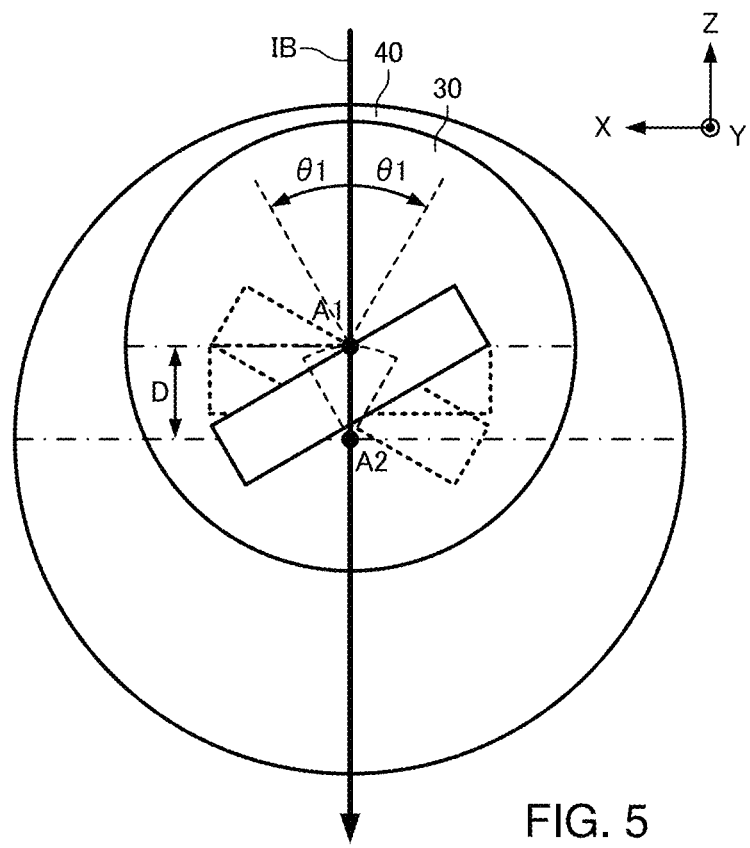
FIG. 5 illustrates an operation of a specimen machining device.
Figure 6:
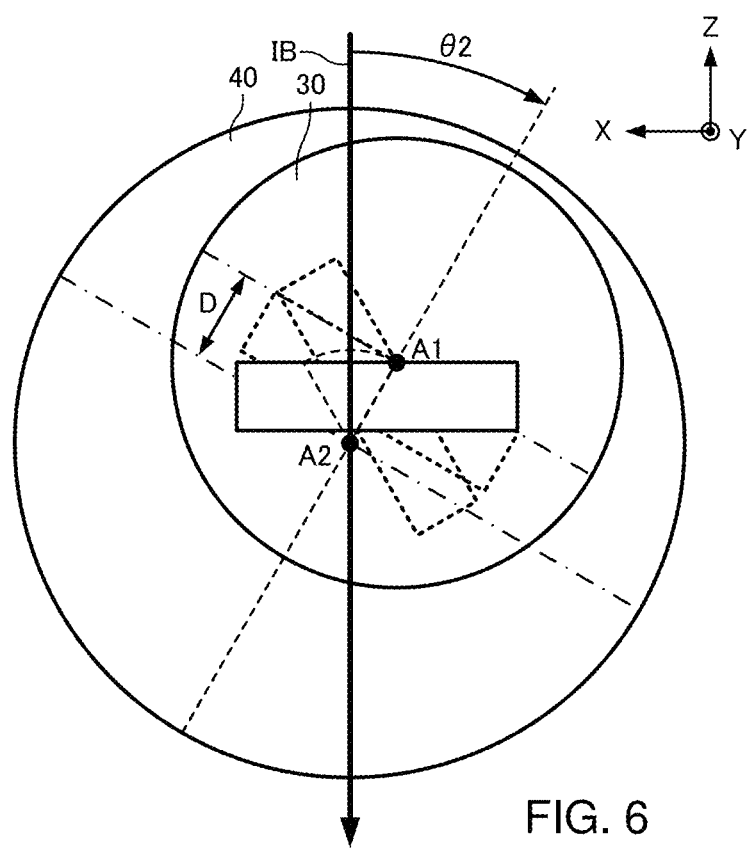
FIG. 6 illustrates an operation of a specimen machining device.
Figure 7:
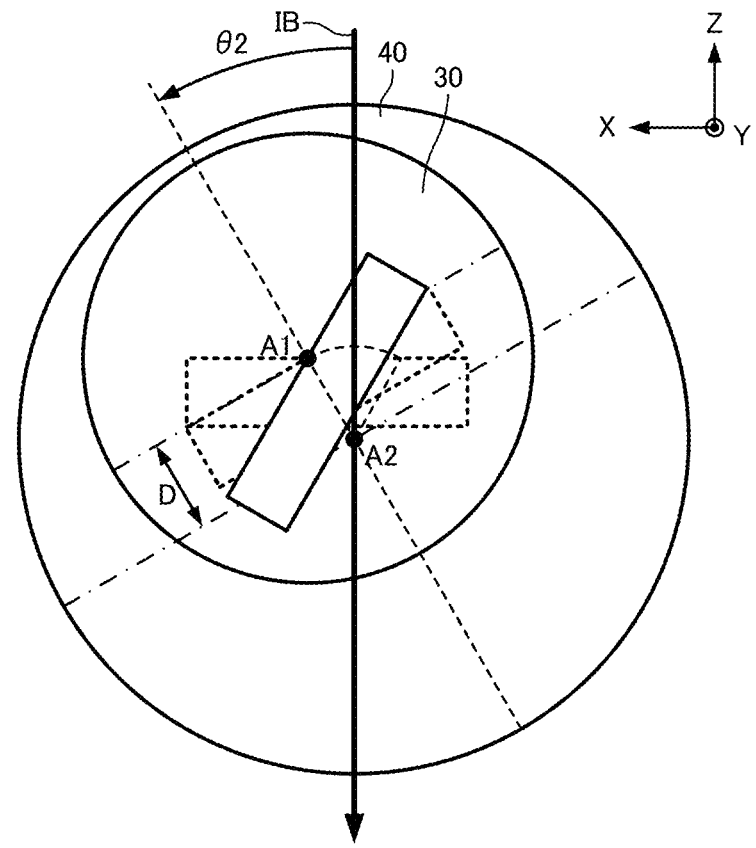
FIG. 7 illustrates an operation of a specimen machining device.

FIGS. 5 to 7 illustrates operations of the specimen machining device 100. FIGS. 5 to 7 correspond to FIG. 4.

FIG. 5 indicates the tilt angle θ2=0° of the specimen stage 40, FIG. 6 indicates the tilt angle θ2=+30° of the specimen stage 40, and FIG. 7 indicates the tilt angle θ2=−30° of the specimen stage 40. In FIGS. 5 to 7, the tilt angle θ2 is determined with respect to the upward vertical direction, "+" denotes a clockwise direction, and "−" denotes a counterclockwise direction.

During machining in the specimen machining device 100, the specimen-holder control unit 74 operates the specimen-holder rotating mechanism 32 to rotate the specimen holder 30, and the specimen-stage control unit 76 operates the specimen-stage rotating mechanism 42 to rotate the specimen stage 40.

The rotation of the specimen holder 30 includes a rotating operation of the specimen holder 30 in one direction and a swinging operation of the specimen holder 30. The swinging of the specimen holder 30 means a reciprocating and tilting (rotating) motion. This also holds true for the rotation of the specimen stage 40.

In the specimen machining device 100, the specimen holder 30 is swung, and the specimen stage 40 is also swung.

The specimen holder 30 swings on the first axis A1 serving as a rotation axis (axis of tilt). The specimen holder 30 swings in the range of, for example, ±30°. Specifically, the specimen holder 30 rotates clockwise to have the tilt angle θ1 of +30° and then rotates counterclockwise to have the tilt angle θ1 of −30°. The swing of the specimen holder 30 can reduce machining streaks on the machining surface. In FIGS. 5 to 7, the tilt angle θ1 is denoted as "+" in the clockwise direction and is denoted as "−" in the counterclockwise direction.

The specimen stage 40 swings on the second axis A2 serving as a rotation axis (axis of tilt). The specimen stage 40 swings in the range of, for example, ±30°. Specifically, the specimen stage 40 rotates clockwise to have the tilt angle θ2 of +30° and then rotates counterclockwise to have the tilt angle θ2 of −30°. The swing of the specimen stage 40 can increase the machining width of the specimen 2. The swinging width is, for example, a width orthogonal to the depth direction of the machining region of the specimen 2. The range of machining can be extended by increasing the machining width of the specimen 2.

The range of the tilt angle θ1 of the specimen holder 30 and the range of the tilt angle θ2 of the specimen stage 40 can be optionally set. For example, the range of the tilt angle θ1 is the same range as the tilt angle θ2 in the foregoing description. The range of the tilt angle θ1 and the range of the tilt angle θ2 may be different from each other.

The specimen holder 30 has, for example, a constant rotation speed. Moreover, the specimen stage 40 has, for example, a constant rotation speed. The specimen holder 30 has, for example, a higher rotation speed than the specimen stage 40. In other words, the specimen holder 30 has a shorter swinging period than the specimen stage 40. The rotation speed of the specimen holder 30 and the rotation speed of the specimen stage 40 can be optionally set. For example, the specimen holder 30 may have a lower rotation speed than the specimen stage 40.

The specimen 2 is rotated by the rotation of the specimen holder 30, and the specimen holder 30 is rotated by the rotation of the specimen stage 40. Hence, the specimen 2 is rotated by the rotation of the specimen stage 40 while being rotated by the rotation of the specimen holder 30. The specimen 2 is moved by the combination of the two rotations.

In the specimen machining device 100, the machining width of the specimen 2 can be changed by changing a center distance D between the first axis A1 of the specimen holder 30 and the second axis A2 of the specimen stage 40.

Moreover, in the specimen machining device 100, the machining width of the specimen 2 can be changed by changing the range of the tilt angle of the specimen 2 with respect to the optical axis of the ion beam IB by the rotation of the specimen holder 30 and the rotation of the specimen stage 40.

In the following description, a change of the machining width of the specimen 2 by changing the center distance D will be referred as a first operation example, whereas a change of the machining width of the specimen 2 by changing the tilt angle range of the specimen 2 will be referred to as a second operation example.

1.2.2. First Operation Example (1) Principle

Figure 8:
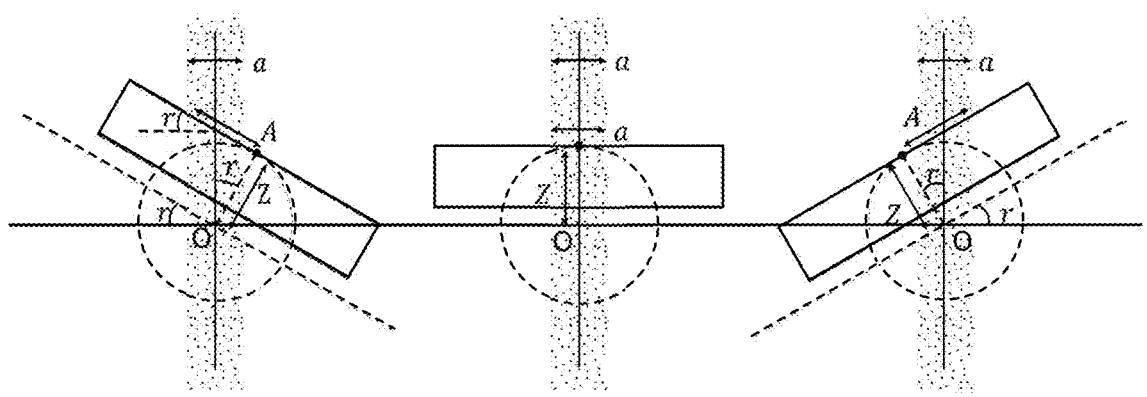
FIG. 8 schematically illustrates an irradiation range of an ion beam.

FIG. 8 schematically illustrates an irradiation range (machining width) of an ion beam.

As illustrated in FIG. 8, a specimen is swung with a tilt axis O serving as a rotation axis. At this point, an irradiation range 2A of the ion beam IB is expressed by Formula (1) where a is the diameter of the ion beam, r is a tilt angle r of the specimen with respect to the optical axis of the ion beam, and Z is a distance between the tilt axis O and the top surface of the specimen.

$$2A = 2\left(Z\tan r + \frac{a}{2\cos r}\right) = 2 \cdot \frac{2Z\sin r + a}{2\cos r} = \frac{2Z\sin r + a}{\cos r} \quad (1)$$

The tilt angle r of the specimen corresponds to the sum of the angle of tilt of the specimen 2 by the rotation of the specimen holder 30 and the angle of tilt of the specimen 2 by the rotation of the specimen stage 40. The distance Z corresponds to the center distance D. The tilt axis O corresponds to the second axis A2. The irradiation range 2A of the ion beam IB corresponds to the machining width of the specimen 2. Thus, it is understood from Formula (1) that the machining width of the specimen 2 can be changed by changing a distance between the first surface 3a and the second axis A2, that is, the center distance D. According to Formula (1), the center distance D can be calculated from the machining width of the specimen 2.

Figure 9:
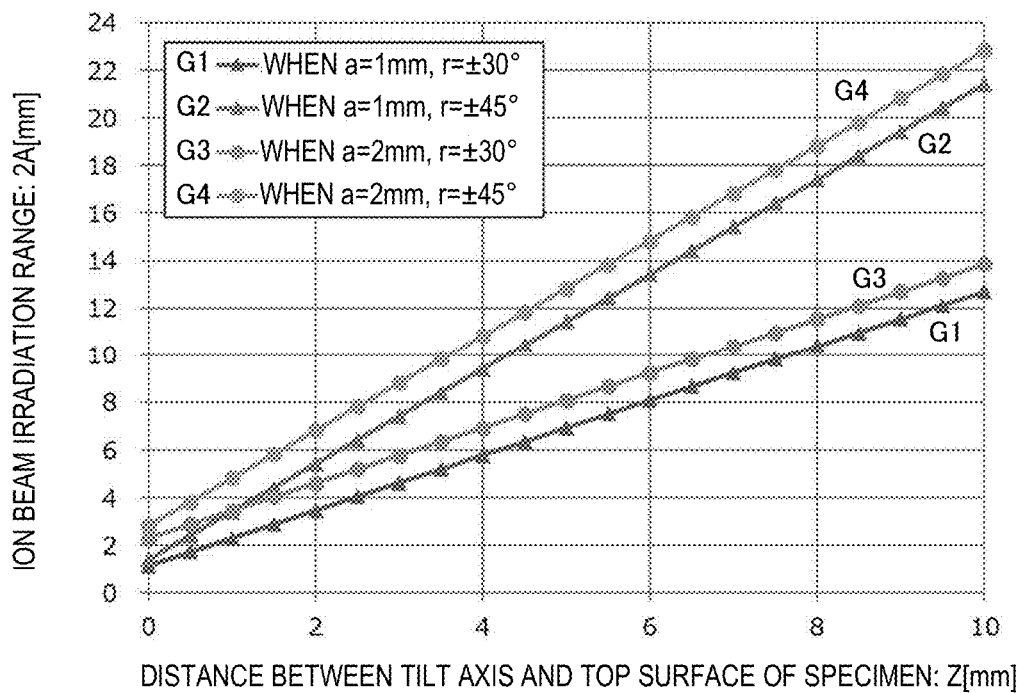
FIG. 9 is a graph indicating a relationship between an irradiation range of an ion beam and a distance between a tilt axis and a first surface.

FIG. 9 is a graph indicating the relationship between the irradiation range 2A of the ion beam IB and the distance Z between the tilt axis O and the first surface 3a. In FIG. 9, the vertical axis of the graph indicates the irradiation range 2A while the horizontal axis indicates the distance Z. The graph in FIG. 9 indicates the ion beam IB having a diameter a of 1 mm with the tilt angle r in the range of ±30° (G1), the ion beam IB having the diameter a of 1 mm with the tilt angle r in the range of ±45° (G2), the ion beam IB having the diameter a of 2 mm with the tilt angle r in the range of ±30° (G3), and the ion beam IB having the diameter a of 2 mm with the tilt angle r in the range of ±45° (G4).

For example, if the diameter a of the ion beam IB is 1 mm and the tilt angle r is in the range of ±30° (G1), the irradiation range 2A is about 2 mm for the distance Z=1 mm, the irradiation range 2A is about 3 mm for the distance Z=2 mm, the irradiation range 2A is about 6 mm for the distance Z=4 mm, and the irradiation range 2A is about 8 mm for the distance Z=6 mm.

In this way, the graph of FIG. 9 proves that the irradiation range 2A of the ion beam IB increases with the distance Z. Thus, in the specimen machining device 100, the machining width can be extended by increasing the center distance D. In this way, the machining width of the specimen 2 can be adjusted by adjusting the center distance D.

Moreover, as indicated in FIG. 9, the irradiation range 2A of the ion beam IB can be changed also by changing the diameter a of the ion beam IB and the range of the tilt angle r of the specimen 2. Hence, the range of an adjustment of the machining width can be increased by changing the center distance D, the diameter a of the ion beam IB, and the range of the tilt angle r.

(2) Specimen Machining Method

First, as illustrated in FIGS. 3 and 4, the specimen 2 and the shield 34 are set on the specimen holder 30. At this point, the specimen 2 is set, with the first surface 3a of the specimen 2 being located on the first axis A1 of the specimen holder 30.

The specimen holder 30 is then attached to the specimen stage 40. The specimen holder 30 is attached while the specimen-stage drawing mechanism 12 is opened. Subsequently, the position of the specimen 2 and the position of the shield 34 are adjusted by using the positioning camera 60.

The center distance D is then calculated according to a desired machining width by using Formula (1). Thereafter, the position of the specimen holder 30 is adjusted by using the slide mechanism 50 such that the center distance D has a calculated value. As will be described later, the value of the center distance D is calculated by the arithmetic unit 78 and is displayed on a GUI screen. The position of the specimen holder 30 may be adjusted with reference to the value of the center distance D displayed on the GUI screen.

Machining is then started. Specifically, the vacuum chamber 10 is first evacuated with the specimen-stage drawing mechanism 12 closed, so that the vacuum chamber 10 is placed in a vacuum. The specimen 2 is irradiated with the ion beam IB via the shield 34 while moving the specimen 2 by the swing of the specimen holder 30 and the swing of the specimen stage 40. The swing of the specimen holder 30 can reduce machining streaks; meanwhile, the swing of the specimen stage 40 can adjust the machining width of the specimen 2 to a desired machining width. The machining state of the specimen 2 can be checked by the machining observation camera 62.

Through these steps, a cross section of the specimen 2 can be machined.

(3) GUI

Figure 10:
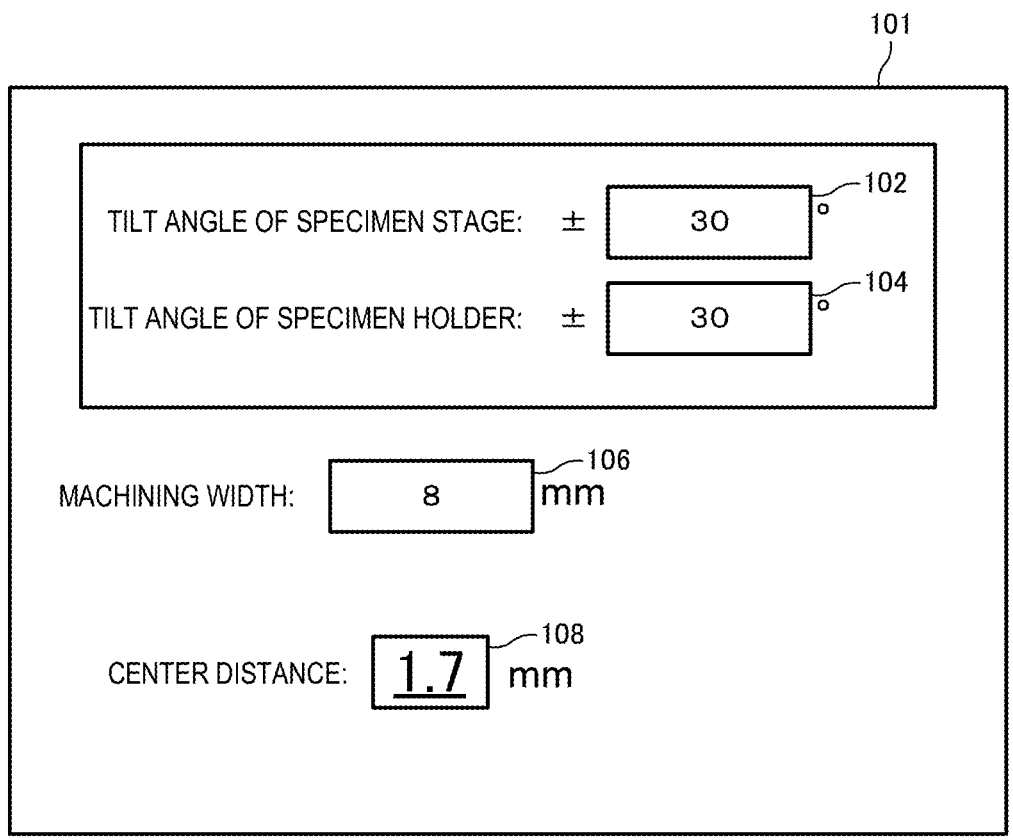
FIG. 10 illustrates an example of a Graphical User Interface (GUI) of a specimen machining device.

FIG. 10 illustrates an example of the Graphical User Interface (GUI) of the specimen machining device 100.

A GUI 101 includes an input area 102 for inputting the range of the tilt angle θ2 of the specimen stage 40, an input area 104 for inputting the range of the tilt angle θ1 of the specimen holder 30, an input area 106 for inputting a machining width, and a result display area 108. The GUI 101 is displayed on the display unit 82.

In the input area 102, the input area 104, and the input area 106, values can be inputted by using the input unit 80. When the user inputs a desired range of the tilt angle θ2 of the specimen stage 40 in the input area 102, a desired range of the tilt angle θ1 of the specimen holder 30 in the input area 104, and a desired machining width in the input area 106 by using the input unit 80, the input unit 80 receives the inputted information and outputs the information to the processing unit 70.

The arithmetic unit 78 substitutes the inputted range of the tilt angle θ2, the inputted range of the tilt angle θ1, and the inputted machining range for Formula (1) to calculate the center distance D. The arithmetic unit 78 then displays the calculated value of the center distance D in the result display area 108. The user can adjust the position of the specimen holder 30 with reference to the value of the center distance D displayed in the result display area 108.

In the foregoing description, the center distance D is displayed in the result display area 108. A distance between the first surface 3a and the second axis A2 may be displayed instead in the result display area 108.

1.2.3. Second Operation Example (1) Principle

If the center distance D is fixed, the machining width of the specimen 2 can be changed by changing the range of the tilt angle r of the specimen 2. The range of the tilt angle r can be changed by controlling the rotation of the specimen holder 30 and the rotation of the specimen stage 40. According to Formula (1), the range of the tilt angle r can be calculated from the machining width.

Figure 11:
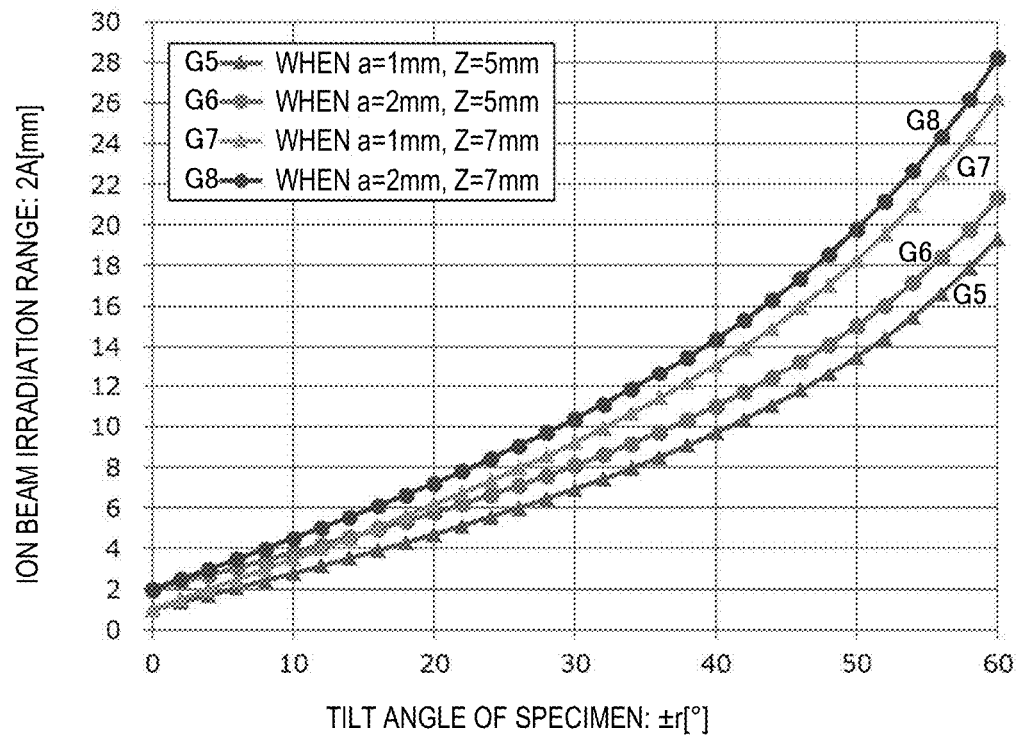
FIG. 11 is a graph indicating a relationship between an irradiation range of an ion beam and a tilt angle of a specimen.

FIG. 11 is a graph indicating the relationship between the irradiation range 2A of the ion beam IB and the tilt angle r of the specimen. In FIG. 11, the vertical axis of the graph indicates the irradiation range 2A while the horizontal axis indicates the range of the tilt angle r. The graph in FIG. 11 indicates the ion beam IB having the diameter a of 1 mm with the distance Z of 5 mm (G5), the ion beam IB having the diameter a of 2 mm with the distance Z of 5 mm (G6), the ion beam IB having the diameter a of 1 mm with the distance Z of 7 mm (G7), and the ion beam IB having the diameter a of 2 mm with the distance Z of 7 mm (G8).

For example, if the diameter a of the ion beam IB is 1 mm and the distance Z is 5 mm (G5), the irradiation range 2A is about 2 mm with the tilt angle r of ±10°, the irradiation range 2A is about 4 mm with the tilt angle r of ±20°, the irradiation range 2A is about 7 mm with the tilt angle r of the tilt angle r of ±30°, and the irradiation range 2A is about 10 mm with the tilt angle r of ±40°.

In this way, the graph of FIG. 11 proves that the irradiation range 2A of the ion beam IB increases with the range of the tilt angle r. Thus, in the specimen machining device 100, the machining width can be extended by increasing the range of the tilt angle r. In this way, the machining width of the specimen 2 can be adjusted by adjusting the range of the tilt angle r.

(2) Specimen Machining Method

First, as illustrated in FIGS. 3 and 4, the specimen 2 and the shield 34 are set on the specimen holder 30. At this point, the specimen 2 is set, with the first surface 3a of the specimen being 2 located on the first axis A1 of the specimen holder 30.

The specimen holder 30 is then attached to the specimen stage 40. The specimen holder 30 is attached while the specimen-stage drawing mechanism 12 is opened. Subsequently, the position of the specimen 2 and the position of the shield 34 are adjusted by using the positioning camera 60.

Thereafter, the position of the specimen holder 30 is adjusted by using the slide mechanism 50. At this point, the center distance D has a predetermined value.

Subsequently, the tilt angle r is calculated according to a desired machining width by using Formula (1), and the range of the tilt angle θ1 of the specimen holder 30 and the range of the tilt angle θ2 of the specimen stage 40 are set. As will be described later, when the range of the tilt angle θ2 and the machining width are inputted on the GUI screen, the arithmetic unit 78 calculates the range of the tilt angle θ1, so that the calculated range of the tilt angle θ1 and the inputted range of the tilt angle θ2 are set.

Machining is then started. Specifically, the vacuum chamber 10 is first evacuated with the specimen-stage drawing mechanism 12 closed, so that the vacuum chamber 10 is placed in a vacuum. The specimen 2 is irradiated with the ion beam IB via the shield 34 while moving the machining image 2 by the swing of the specimen holder 30 and the swing of the specimen stage 40.

At this point, the specimen-holder control unit 74 swings the specimen holder 30 in the set range of the tilt angle θ1, and the specimen-stage control unit 76 swings the specimen stage 40 in the set range of the tilt angle θ2. Thus, the swing of the specimen holder 30 can reduce machining streaks; meanwhile, the swing of the specimen stage 40 can adjust the machining width of the specimen 2 to a desired machining width.

Through these steps, a cross section of the specimen 2 can be machined.

(3) GUI

Figure 12:
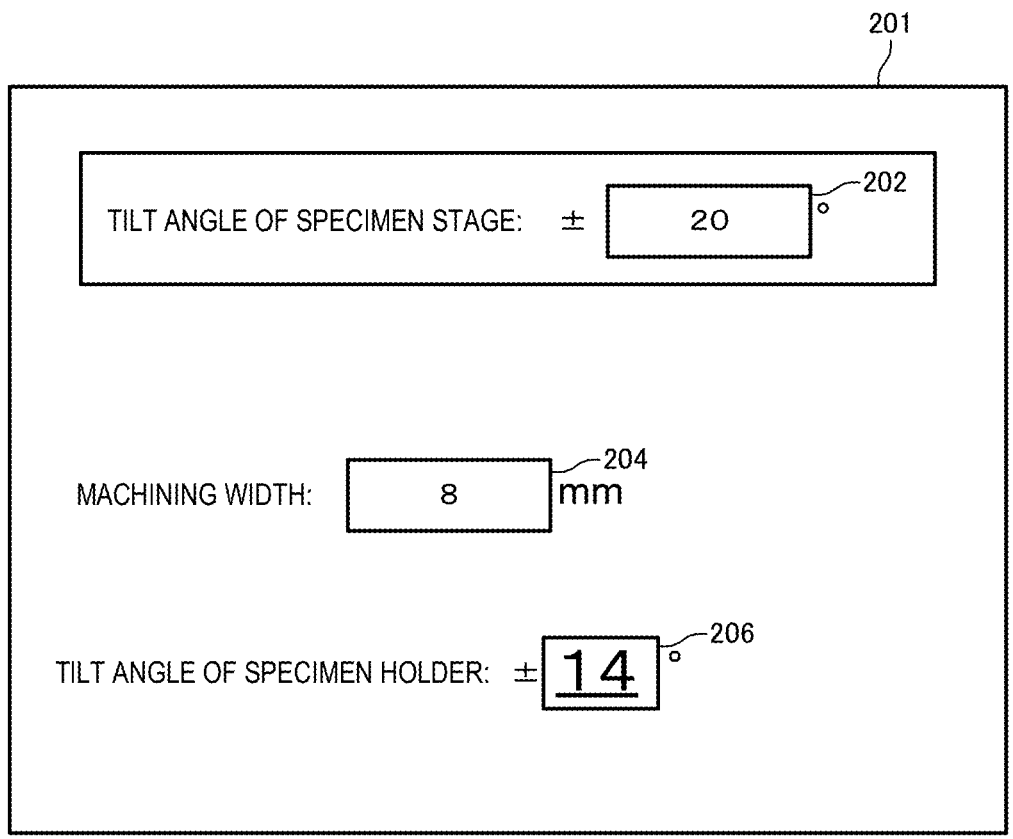
FIG. 12 illustrates an example of a GUI of a specimen machining device.

FIG. 12 illustrates an example of the GUI of the specimen machining device 100.

A GUI 201 includes an input area 202 for inputting the range of the tilt angle θ2 of the specimen stage 40, an input area 204 for inputting a machining width, and a result display area 206. The GUI 201 is displayed on the display unit 82.

In the input area 202 and the input area 204, values can be inputted by using the input unit 80. When the user inputs a desired range of the tilt angle θ2 of the specimen stage 40 in the input area 202 and a desired machining width in the input area 204, the input unit 80 receives the inputted information and outputs the information to the processing unit 70.

The arithmetic unit 78 substitutes the inputted range of the tilt angle θ2, the inputted machining width, and the predetermined center distance D for Formula (1) to calculate the range of the tilt angle θ1 of the specimen holder 30. The arithmetic unit 78 then displays the calculated range of the tilt angle θ1 in the result display area 206. Moreover, the specimen-holder control unit 74 swings the specimen holder 30 in the calculated range of the tilt angle θ1, which is calculated by the arithmetic unit 78, during machining.

Figure 13:
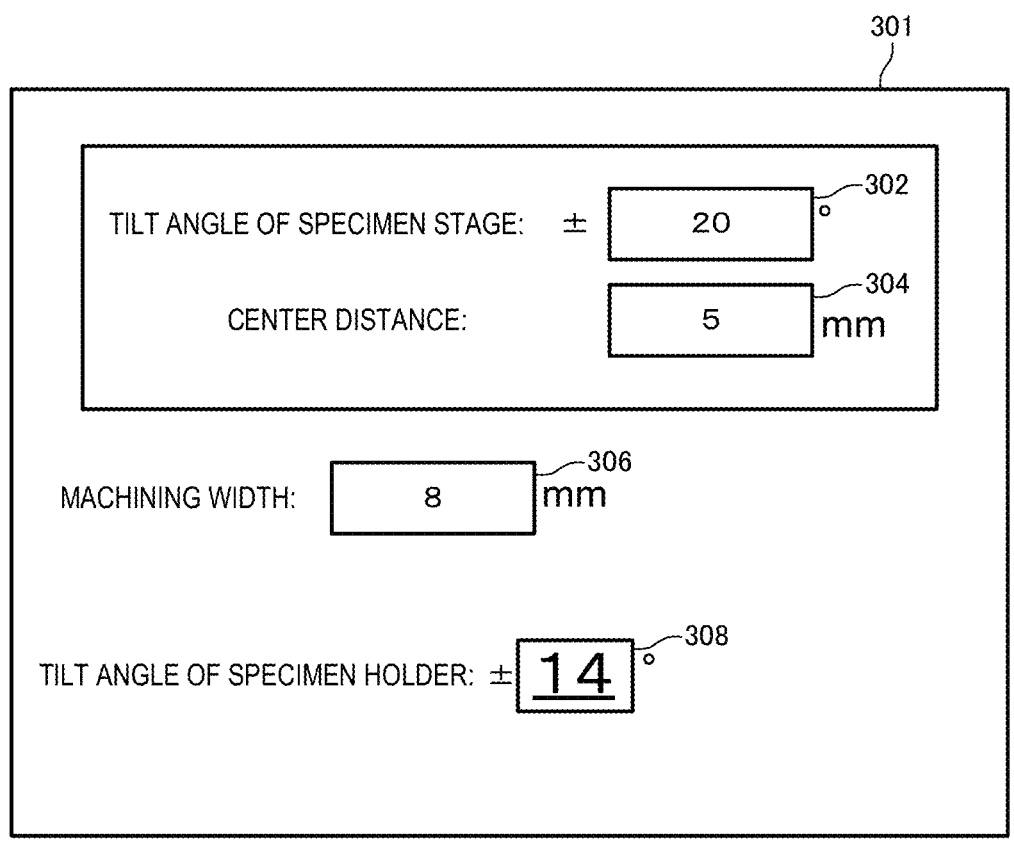
FIG. 13 illustrates an example of a GUI of a specimen machining device.

FIG. 13 illustrates an example of the GUI of the specimen machining device 100.

A GUI 301 includes an input area 302 for inputting the range of the tilt angle θ2 of the specimen stage 40, an input area 304 for inputting the center distance D, an input area 306 for inputting a machining width, and a result display area 308. The GUI 301 is displayed on the display unit 82.

In the input area 302, the input area 304, and the input area 306, values can be inputted by using the input unit 80. When the user inputs a desired range of the tilt angle θ2 of the specimen stage 40 in the input area 302, a desired center distance D in the input area 304, and a desired machining width in the input area 306, the arithmetic unit 78 substitutes the inputted range of the tilt angle θ2, the inputted center distance D, and the inputted machining width for Formula (1) and calculates the range of the tilt angle θ1 of the specimen holder 30. The arithmetic unit 78 then displays the calculated range of the tilt angle θ1 in the result display area 308. The specimen-holder control unit 74 swings the specimen holder 30 in the calculated range of the tilt angle θ1, which is calculated by the arithmetic unit 78, during machining.

1.3. Effects

The specimen machining device 100 includes the specimen holder 30 serving as a first rotating body that holds the specimen 2 and is rotatable about the first axis A1 serving as a rotation axis, and the specimen stage 40 serving as a second rotating body that has the specimen holder 30 disposed thereon and is rotatable about the second axis A2 serving as a rotation axis different from the first axis A1. The specimen machining device 100 irradiates the specimen 2 with the ion beam IB while moving the specimen 2 by the rotation of the specimen holder 30 and the rotation of the specimen stage 40. Thus, the specimen machining device 100 can reduce machining streaks on the machining surface and extend the machining width of the specimen 2. Hence, the specimen machining device 100 can reduce machining streaks on the machining surface and extend the machining range of the specimen 2.

Figure 14:
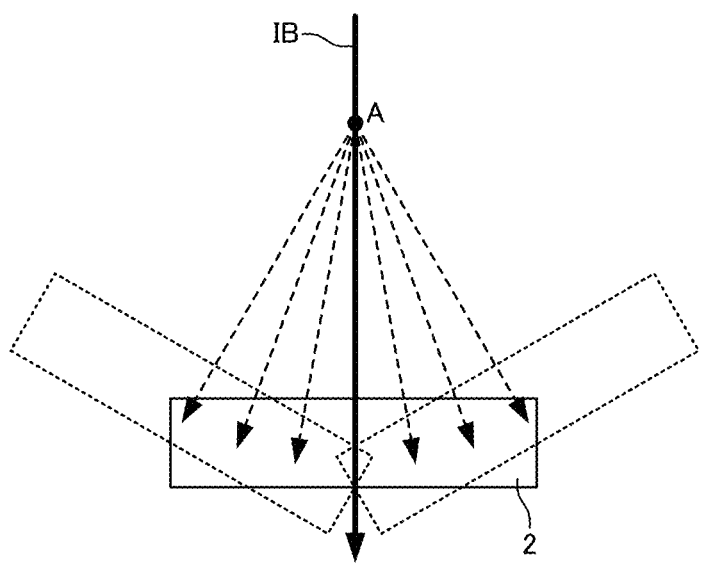
FIG. 14 illustrates an operation of a specimen machining device according to a comparative example.

FIG. 14 illustrates an operation of a specimen machining device according to a comparative example. The specimen machining device in FIG. 14 includes a rotating mechanism that rotationally supports the specimen stage and a slide mechanism that supports a specimen held on a specimen holder so as to move the specimen along the direction of the optical axis of an ion beam. The specimen swings on an axis A serving as a rotation axis. In the specimen machining device of the comparative example, the machining width can be extended by increasing a distance between the axis A and the top surface of the specimen by sliding the specimen via the slide mechanism.

In the specimen machining device of the comparative example, the specimen is moved by the rotation of the single rotating body. In contrast, as described above, the specimen machining device 100 reduces machining streaks by the rotation of the specimen holder 30 and extends the machining width of the specimen 2 by the rotation of the specimen stage 40. In this way, in the specimen machining device 100, the specimen is moved by the rotations of the two rotating bodies. This can reduce machining streaks as compared with the rotation of the specimen 2 by the rotation of the single rotating body illustrated in FIG. 14.

In the specimen machining device 100, the first surface 3a of the specimen 2 is disposed on the first axis A1, and a distance between the first surface 3a of the specimen 2 and the second axis A2 can be changed. The machining width of the specimen 2 is changed by changing the distance between the first surface 3a of the specimen 2 and the second axis A2. Thus, the specimen machining device 100 can extend the machining width of the specimen 2.

In the specimen machining device 100, the center distance D between the first axis A1 and the second axis A2 can be changed. The machining width of the specimen 2 is changed by changing the center distance D. Thus, the specimen machining device 100 can extend the machining width of the specimen 2.

In the specimen machining device 100, the machining width of the specimen 2 is changed by changing the range of the tilt angle r of the specimen 2 with respect to the optical axis of the ion beam IB by the rotation of the specimen holder 30 and the rotation of the specimen stage 40. Hence, the specimen machining device 100 can extend the machining width of the specimen 2.

The specimen machining device 100 includes the shield 34 that is disposed on the specimen 2 and partially blocks the ion beam IB. The ion beam IB is emitted to the specimen 2 through the shield 34. Hence, the specimen machining device 100 can machine a cross section of the specimen 2.

The specimen machining device 100 includes the input unit 80 that receives the input of information about the machining width of the specimen 2 and the arithmetic unit 78 that calculates the center distance D between the first axis A1 and the second axis A2 based on the information about the machining width. Hence, the specimen machining device 100 can easily obtain information about the center distance D for machining with a desired machining width.

The specimen machining device 100 includes the input unit 80 that receives the input of information about the machining width of the specimen 2 and the arithmetic unit 78 that calculates the range of the tilt angle r of the specimen 2 based on the information about the machining width. Hence, the specimen machining device 100 can easily obtain information about the range of the tilt angle r of the specimen 2 in order to perform machining with a desired machining width.

1.4. Modifications

Modifications of the specimen machining device according to the first embodiment will be described below. Differences from the example of the specimen machining device 100 will be described below, and an explanation of similar points is omitted.

1.4.1. First Modification

In the foregoing embodiment, the specimen holder 30 has a constant rotation speed, and the specimen stage 40 has a constant rotation speed. The rotation speeds are not limited thereto.

For example, the rotation speed of the specimen stage 40 may be periodically changed while the rotation speed of the specimen holder 30 is fixed. For example, the rotation speed of the specimen stage 40 may be fixed while the rotation speed of the specimen holder 30 is periodically changed. For example, the rotation speed of the specimen holder 30 may be periodically changed, and the rotation speed of the specimen stage 40 may be periodically changed. Thus, machining streaks can be reduced as compared with, for example, the case where the specimen holder 30 has a constant rotation speed and the specimen stage 40 has a constant rotation speed.

For example, if the rotation of the specimen holder 30 and the rotation of the specimen stage 40 are synchronized with each other, the ion beam IB enters a specific position of the specimen 2 in the same direction, causing machining streaks. In the first modification, as described above, at least one of the rotation speed of the specimen holder 30 and the rotation speed of the specimen stage 40 is periodically changed. This can prevent synchronization between the rotation of the specimen holder 30 and the rotation of the specimen stage 40, thereby reducing machining streaks.

1.4.2. Second Modification

In the second modification, the rotation of the specimen holder 30 and the rotation of the specimen stage 40 are synchronized with each other. In this case, a positive state of the tilt angle r of the specimen 2 and a negative state the tilt angle r of the specimen 2 are equally proportioned. This can irradiate the specimen 2 with the ion beam IB in various directions.

Figure 15:
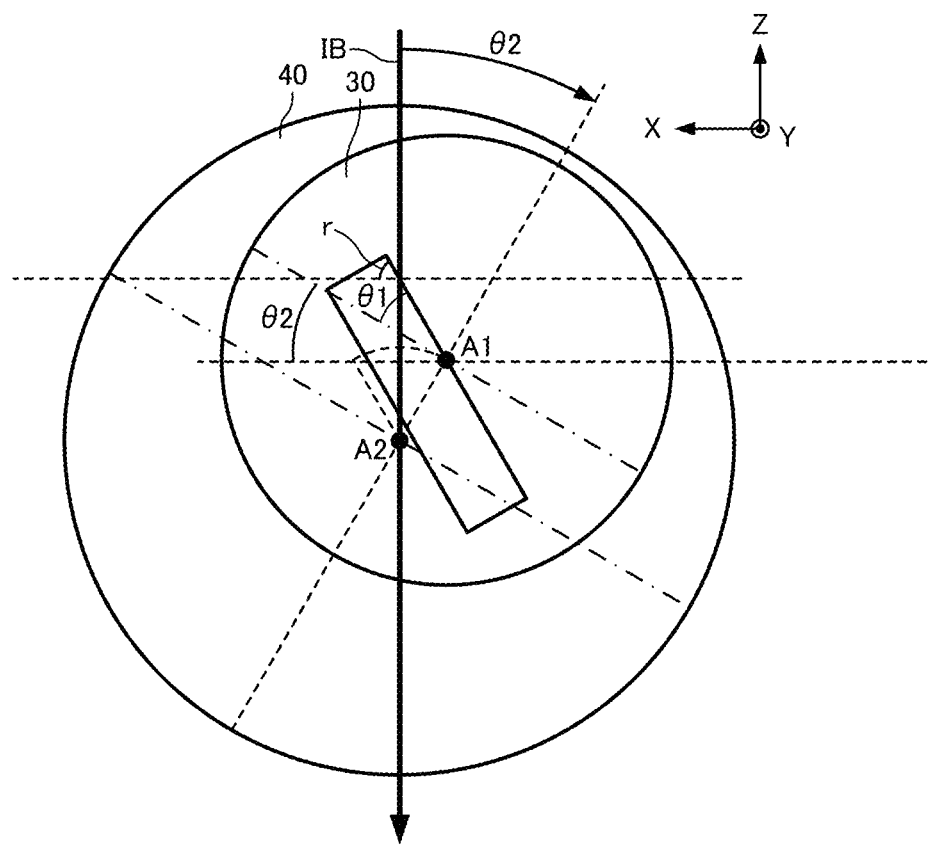
FIG. 15 illustrates an operation of a specimen machining device according to the second modification of the first embodiment.

FIG. 15 illustrates an operation of a specimen machining device according to the second modification.

For example, the rotation of the specimen holder 30 and the rotation of the specimen stage 40 are controlled such that the tilt angle r of the specimen 2 is in the range of ±R (R is any angle).

For example, the specimen stage 40 stops rotating for a predetermined time at each predetermined rotation angle while the specimen holder 30 rotates at least one cycle in the predetermined time during which the specimen stage 40 stops rotating. In this case, r=θ1+θ2 is determined. Thus, when the tilt angle θ2 of the specimen stage 40 is α°, the specimen holder 30 is swung with the tilt angle θ1 ranging from +R-α to −R-α.

For example, R=60° is set, and the specimen stage 40 swings to stop for 60 seconds every 10° in the range of ±20°. For example, the specimen stage 40 stops at the tilt angle θ2=0°, the tilt angle θ2=+10°, the tilt angle θ2=+20°, the tilt angle θ2=−10°, and the tilt angle θ2=−20°.

At this point, the specimen holder 30 swings in the range of +60° to −60° for 60 seconds during which the specimen stage 40 stops at the tilt angle θ2=0°. The specimen holder 30 swings in the range of +50° to −70° for 60 seconds during which the specimen stage 40 stops at the tilt angle θ2=+10°. The specimen holder 30 swings in the range of +40° to −80° for 60 seconds during which the specimen stage 40 stops at the tilt angle θ2=+20°. The specimen holder 30 swings in the range of +70° to −50° for 60 seconds during which the specimen stage 40 stops at the tilt angle θ2=−10°. The specimen holder 30 swings in the range of +80° to −40° for 60 seconds during which the specimen stage 40 stops at the tilt angle θ2=−20°.

Thus, a positive state of the tilt angle r of the specimen 2 and a negative state the tilt angle r of the specimen 2 can be equally proportioned.

In the second modification, the specimen stage 40 stops rotating for a predetermined time at each predetermined rotation angle while the specimen holder 30 rotates at least one cycle in the predetermined time during which the specimen stage 40 stops rotating. This can irradiate the specimen 2 with the ion beam IB in various directions, thereby reducing machining streaks.

1.4.3. Third Modification

In a third modification, the rotation of the specimen holder 30 and the rotation of the specimen stage 40 are synchronized with each other as in the second modification. In the third modification, while the specimen stage 40 rotates one cycle, the rotation of the specimen holder 30 and the rotation of the specimen stage 40 are synchronized with each other so as to maximize the tilt angle θ1 of the specimen holder 30 on the positive side when the tilt angle θ2 of the specimen stage 40 is maximized on the positive side and maximize the tilt angle θ1 of the specimen holder 30 on the negative side when the tilt angle θ2 of the specimen stage 40 is maximized on the negative side.

For example, if the specimen stage 40 swings in the range of ±30° and the specimen holder 30 swings in the range of ±30°, the rotation of the specimen holder 30 and the rotation of the specimen stage 40 are synchronized with each other so as to set the tilt angle θ2 of the specimen holder 30 at +30° when the tilt angle θ1 of the specimen stage 40 is +30° and set the tilt angle θ2 of the specimen holder 30 at −30° when the tilt angle θ2 of the specimen stage 40 is −30°.

For example, the specimen stage 40 stops rotating for a predetermined time at each predetermined rotation angle while the specimen holder 30 rotates at least one cycle in the predetermined time during which the specimen stage 40 stops rotating. Thus, while the specimen stage 40 rotates one cycle, the rotation of the specimen holder 30 and the rotation of the specimen stage 40 can be synchronized with each other so as to maximize the tilt angle θ1 on the positive side when the tilt angle θ2 is maximized on the positive side and maximize the tilt angle θ1 on the negative side when the tilt angle θ2 is maximized on the negative side.

For example, the specimen stage 40 swings to stop for 60 seconds every 10° with the tilt angle θ2 in the range of ±30°. At this point, the specimen holder 30 swings with the tilt angle θ1 in the range of ±30° for 60 seconds during which the specimen stage 40 stops. Thus, the tilt angle θ1 can be set at +30° when the tilt angle θ2 is +30°, and the tilt angle θ1 can be set at −30° when the tilt angle θ2 is −30°.

In the second modification, while the specimen stage 40 rotates one cycle, the rotation of the specimen holder 30 and the rotation of the specimen stage 40 can be synchronized with each other so as to maximize the tilt angle θ1 on the positive side when the tilt angle θ2 is maximized on the positive side and maximize the tilt angle θ1 on the negative side when the tilt angle θ2 is maximized on the negative side. Hence, in the second modification, the ends of the machining region can be securely irradiated with the ion beam IB in the width direction.

1.4.4. Fourth Modification

In the foregoing embodiment, the center distance D is manually changed according to a machining width by using the slide mechanism 50. For example, the slide mechanism 50 may be an actuator that makes a linear motion by transmitting the torque of a motor to a drive mechanism. In other words, the slide mechanism 50 may be a mechanism capable of automatically adjusting the position of the specimen holder 30 in Z direction.

For example, the specimen-holder control unit 74 may change the center distance D according to the machining width by operating the slide mechanism 50 based on the calculation result of the center distance D, the calculation result being obtained by the arithmetic unit 78.

1.4.5. Fifth Modification

In the foregoing embodiment, the center distance D is changed by moving the specimen holder 30 via the slide mechanism 50. The method of changing the center distance D is not limited thereto. For example, the specimen machining device 100 may be provided with a slide mechanism for moving the specimen stage 40 in Z direction. The center distance D may be changed by moving the specimen stage 40.

2. Second Embodiment

2.1. Configuration of Specimen Machining Device

Figure 16:
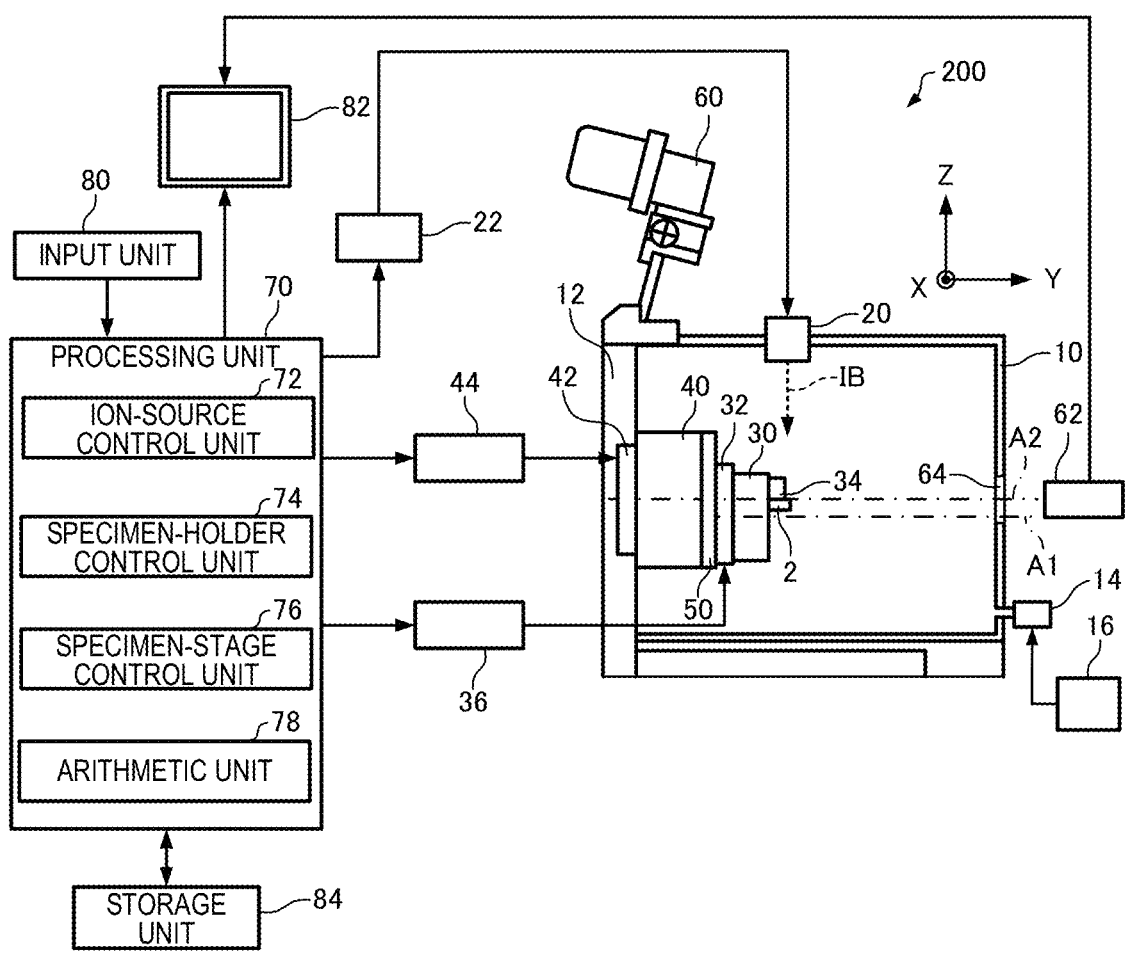
FIG. 16 illustrates a configuration of a specimen machining device according to the second embodiment.

A specimen machining device according to the second embodiment will be described below with reference to the accompanying drawings. FIG. 16 illustrates an configuration of a specimen machining device 200 according to the second embodiment. In the specimen machining device 200 according to the second embodiment, members having the same functions as the components of the specimen machining device 100 according to the first embodiment are indicated by the same reference numerals, and a detailed explanation thereof is omitted.

The specimen machining device 100 reduces machining streaks on the machining surface by the rotation of the specimen holder 30 and extends the machining width of the specimen 2 by the rotation of the specimen stage 40. In contrast, the specimen machining device 200 extends the machining width of a specimen 2 by the rotation of a specimen holder 30 and reduces machining streaks on a machining surface by the rotation of a specimen stage 40.

In the specimen machining device 200, a machining observation camera 62 is disposed such that the optical axis of the machining observation camera 62 is aligned with a second axis A2.

2.2. Operation of Specimen Machining Device

Figure 17:
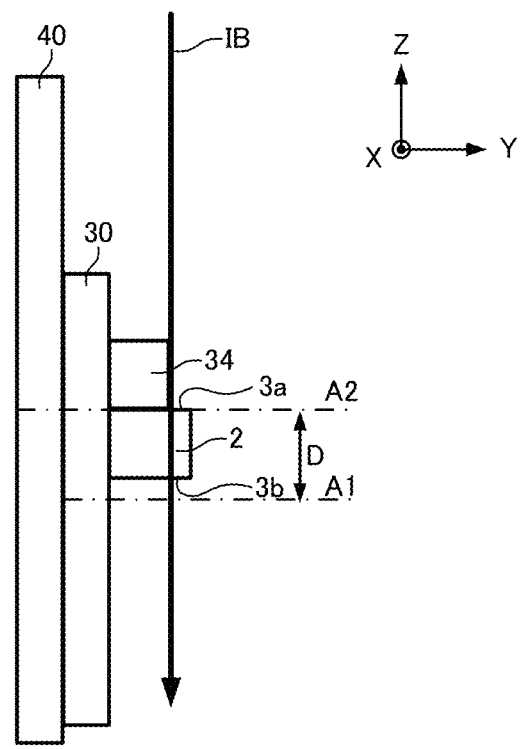
FIG. 17 schematically illustrates a specimen set on a specimen holder.
Figure 18:
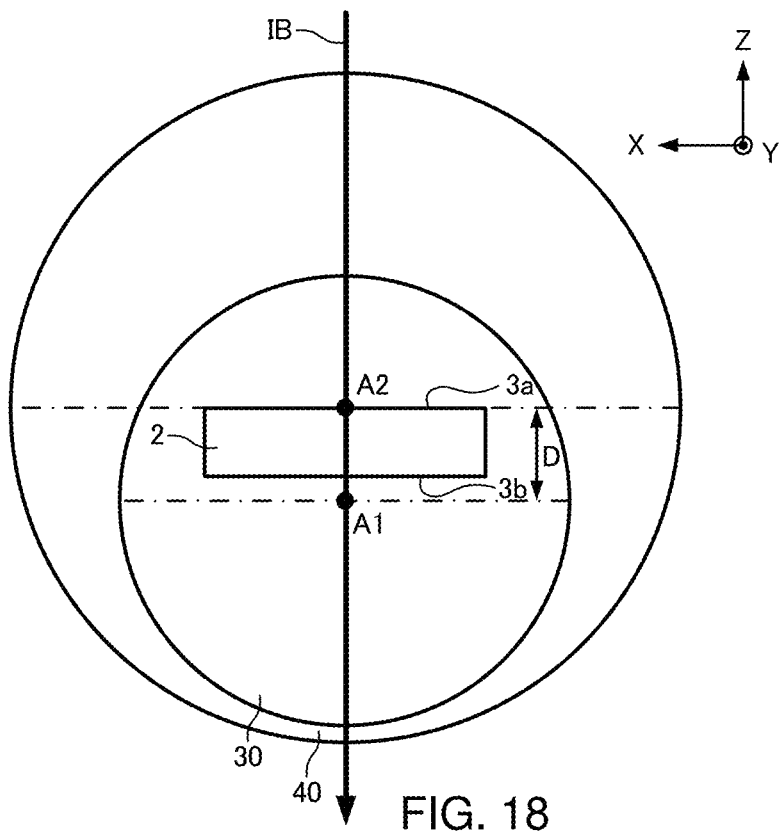
FIG. 18 schematically illustrates a specimen set on a specimen holder.

FIGS. 17 and 18 schematically illustrate the specimen 2 set on the specimen holder 30. FIG. 17 corresponds to FIG. 3, and FIG. 18 corresponds to FIG. 4.

As illustrated in FIGS. 17 and 18, the specimen 2 is disposed with a first surface 3a located on the second axis A2. A shield 34 is disposed on the first surface 3a, and the second axis A2 passes the boundary between the first surface 3a and the shield 34.

Figure 19:
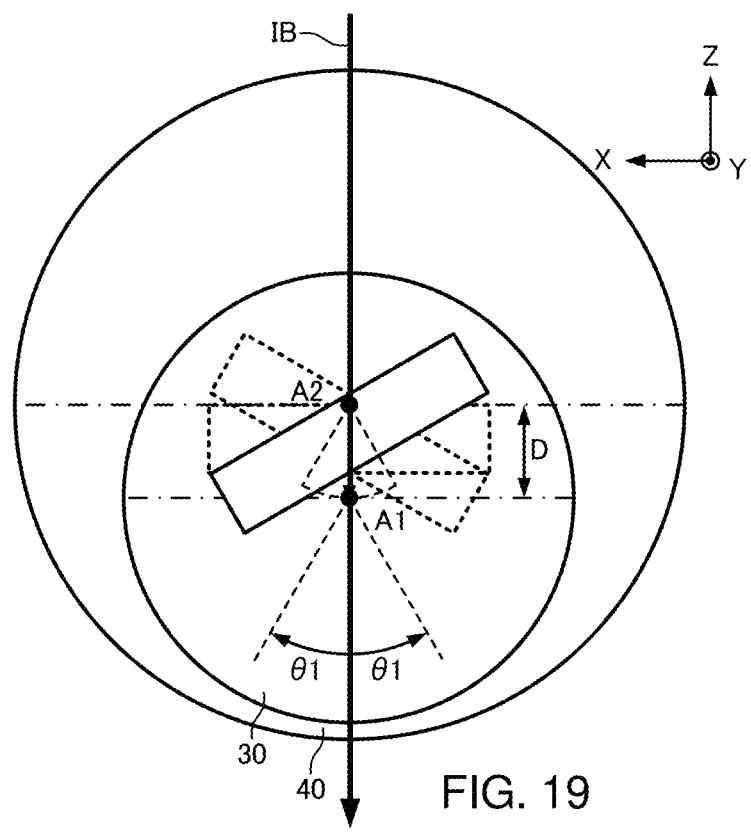
FIG. 19 illustrates an operation of a specimen machining device.
Figure 20:
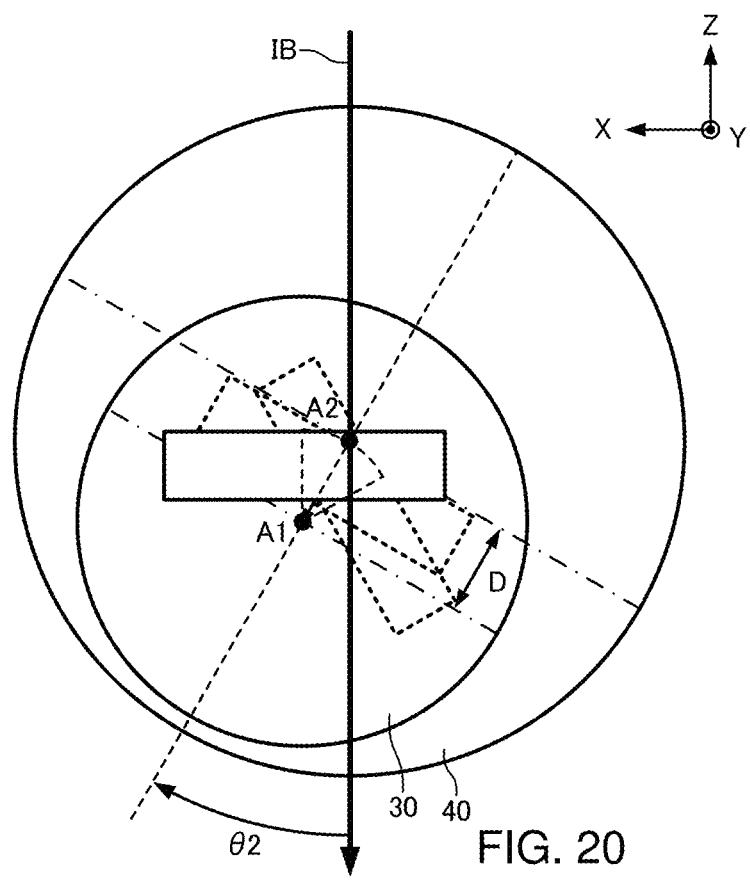
FIG. 20 illustrates an operation of a specimen machining device.
Figure 21:
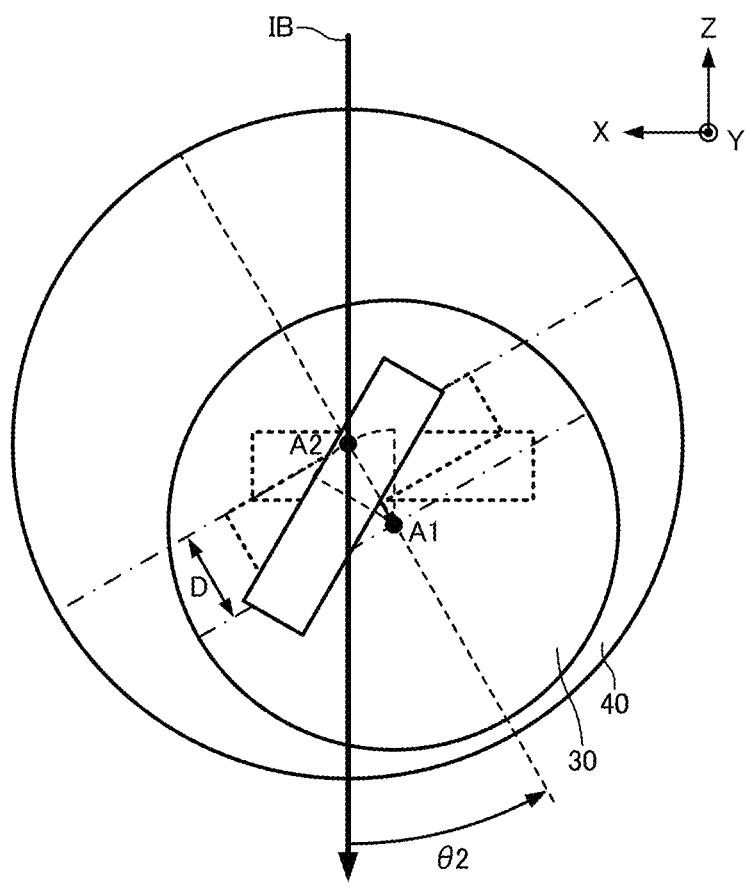
FIG. 21 illustrates an operation of a specimen machining device.

FIGS. 19 to 21 illustrate operations of the specimen machining device 200. FIGS. 19 to 21 correspond to FIGS. 5 to 7. In FIGS. 19 to 21, a tilt angle θ2 is determined with respect to the downward vertical direction.

During machining in the specimen machining device 200, as in the specimen machining device 100, a specimen-holder control unit 74 operates a specimen-holder rotating mechanism 32 to rotate the specimen holder 30, and a specimen-stage control unit 76 operates a specimen-stage rotating mechanism 42 to rotate the specimen stage 40.

At this point, the specimen holder 30 swings on a first axis A1 serving as a rotation axis. The swing of the specimen holder 30 can increase the machining width of the specimen 2. The specimen stage 40 swings on the second axis A2 serving as a rotation axis. The swing of the specimen stage 40 can reduce machining streaks on the machining surface.

In the specimen machining device 200, the first surface 3a of the specimen 2 is disposed on the second axis A2, and a distance between the first surface 3a of the specimen 2 and the first axis A1 can be changed. The machining width of the specimen 2 can be changed by changing a distance between the first surface 3a of the specimen 2 and the first axis A1.

Moreover, in the specimen machining device 200, as in the specimen machining device 100, the machining width of the specimen 2 can be changed by changing the range of a tilt angle r of the specimen 2 with respect to the optical axis of an ion beam IB by the rotation of the specimen holder 30 and the rotation of the specimen stage 40.

2.3. Effects

The specimen machining device 200 can obtain the same effects as the specimen machining device 100.

2.4. Modifications

The first modification, the second modification, the third modification, the fourth modification, and the fifth modification of the specimen machining device 100 according to the first embodiment are also applicable to the specimen machining device 200 according to the second embodiment.

3. Third Embodiment

3.1. Configuration of Specimen Machining Device

Figure 22:
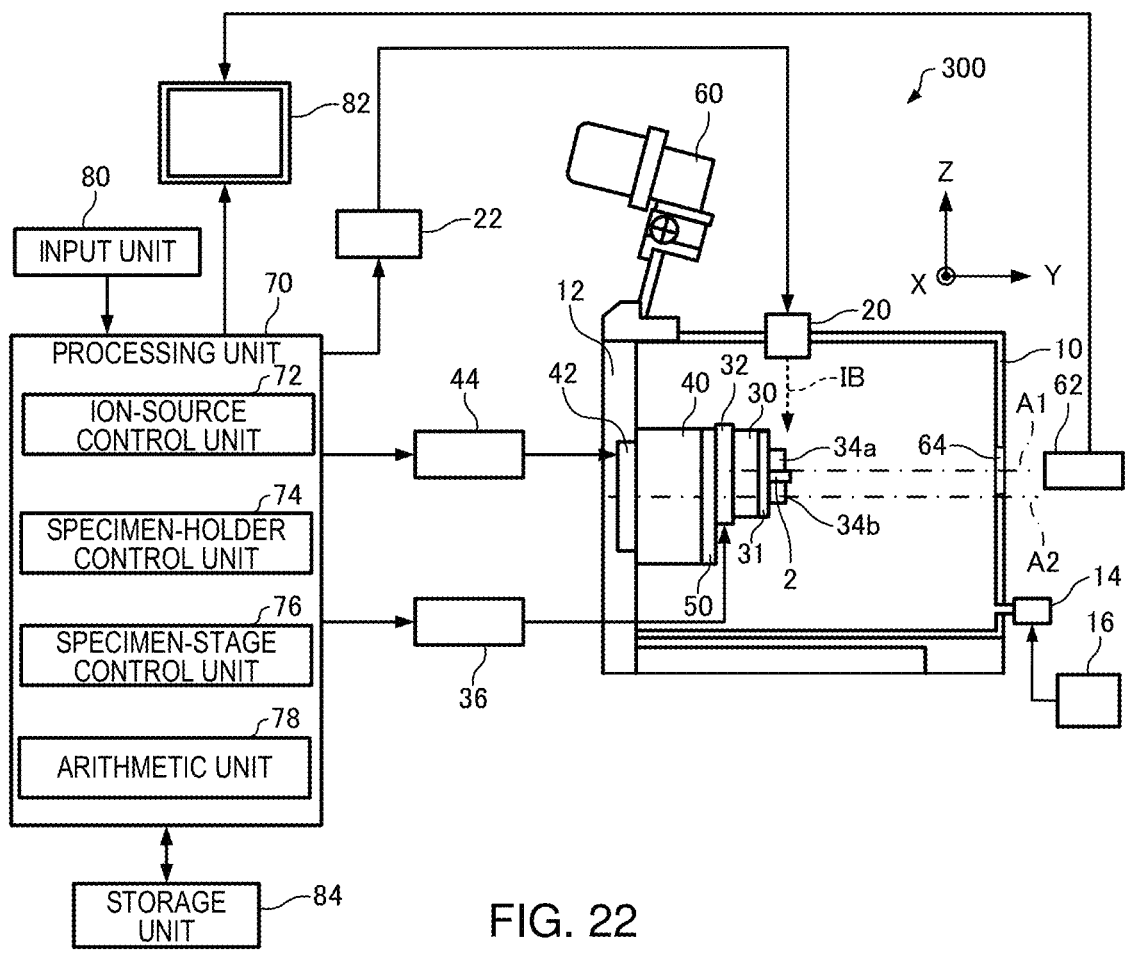
FIG. 22 illustrates a configuration of a specimen machining device according to the third embodiment.

A specimen machining device according to a third embodiment will be described below with reference to the accompanying drawings. FIG. 22 illustrates the configuration of a specimen machining device 300 according to the third embodiment. In the specimen machining device 300 according to the third embodiment, members having the same functions as the components of the specimen machining device 100 according to the first embodiment are indicated by the same reference numerals, and a detailed explanation thereof is omitted.

In the specimen machining device 100, the single shield 34 is attached to the specimen holder 30. In the specimen machining device 300, as illustrated in FIG. 22, two shields (a first shield 34a and a second shield 34b) are attached to a specimen holder 30.

The specimen holder 30 includes a slide mechanism 31 that moves a specimen 2, the first shield 34a, and the second shield 34b along the Z-axis. For example, the slide mechanism 31 is an actuator that makes a linear motion by transmitting the torque of a motor to a drive mechanism. The slide mechanism 31 is controlled by a specimen-holder control unit 74.

3.2. Operation of Specimen Machining Device

3.2.1. Operation of Specimen Holder

Figure 23:
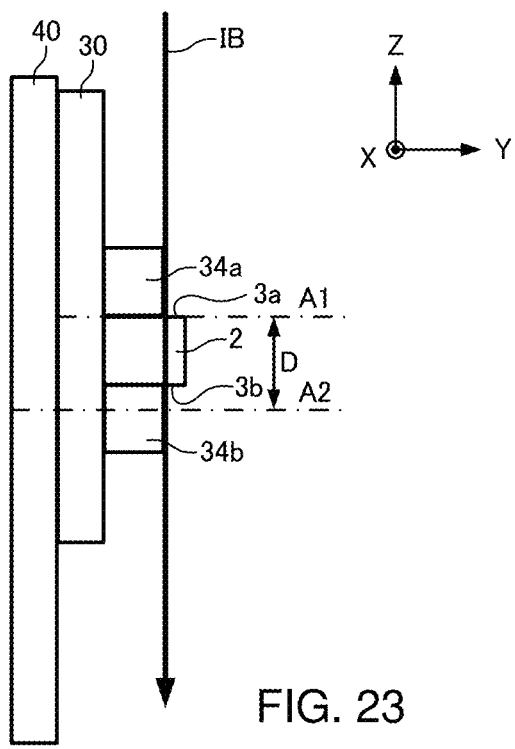
FIG. 23 schematically illustrates a specimen set on a specimen holder.
Figure 24:
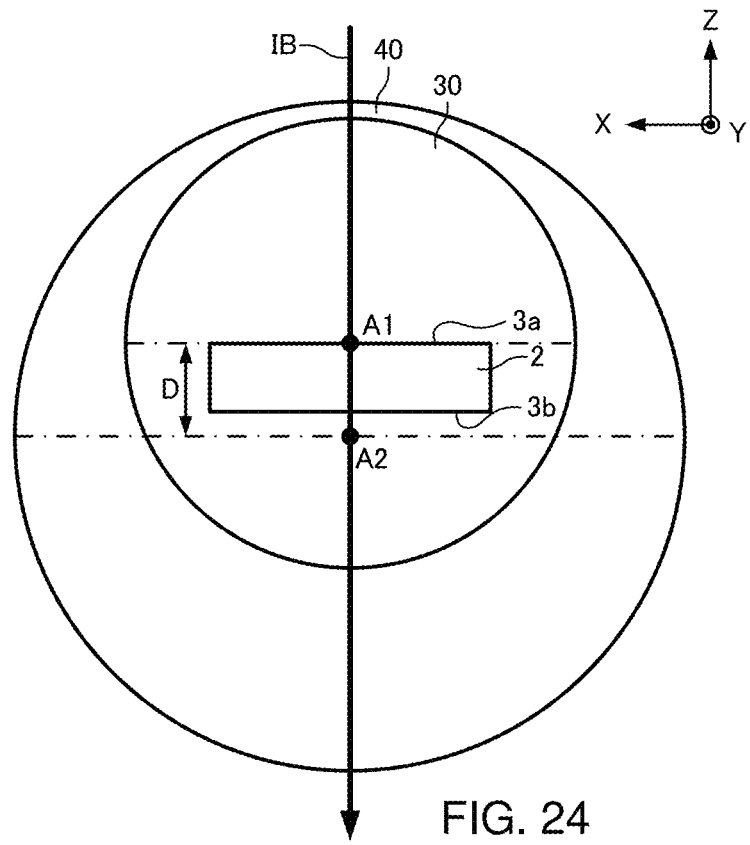
FIG. 24 schematically illustrates a specimen set on a specimen holder.

FIGS. 23 and 24 schematically illustrate the specimen 2 set on the specimen holder 30. FIG. 23 corresponds to FIG. 3, and FIG. 24 corresponds to FIG. 4.

In FIGS. 23 and 24, the specimen 2 is disposed, with a first surface 3a of the specimen 2 being faced upward (+Z direction) and a second surface 3b of the specimen 2 being faced downward (−Z direction). The specimen 2 is disposed with the first surface 3a located on a first axis A1. The first shield 34a is disposed on the first surface 3a, and the second shield 34b is disposed on the second surface 3b.

The specimen machining device 300 rotates the specimen holder 30 so as to switch a state of irradiation of an ion beam IB from the first surface 3a of the specimen 2 and a state of irradiation of the ion beam IB from the second surface 3b of the specimen 2.

Figure 25:
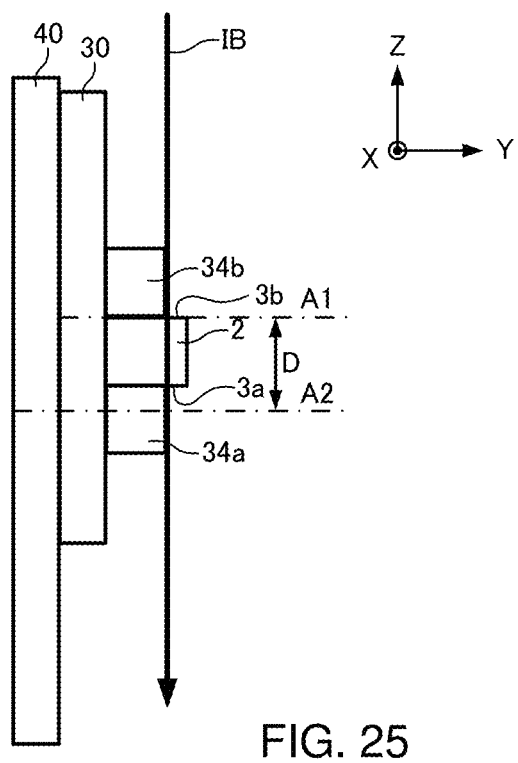
FIG. 25 schematically illustrates a specimen rotated 180°.
Figure 26:
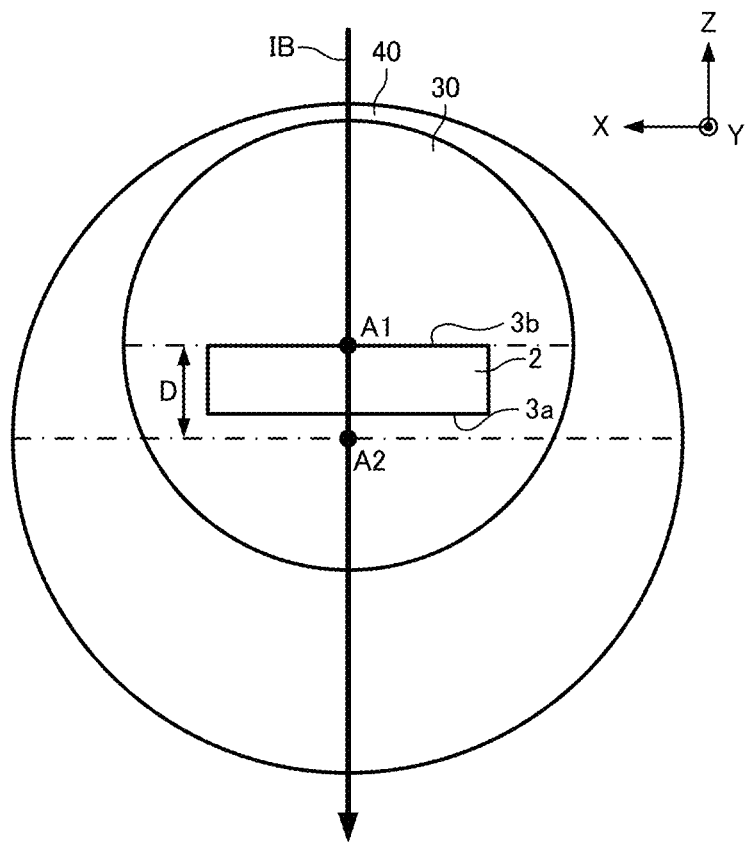
FIG. 26 schematically illustrates a specimen rotated 180°.

FIGS. 25 and 26 schematically illustrate the specimen 2 that is rotated 180° by rotating the specimen holder 30. FIG. 25 corresponds to FIG. 23, and FIG. 26 corresponds to FIG. 24.

The specimen holder 30 is rotated 180°, so that the specimen 2 can be disposed, with the first surface 3a of the specimen 2 being faced downward and the second surface 3b of the specimen 2 being faced upward. Moreover, the specimen 2 is moved in −Z direction according to the thickness of the specimen 2 by the slide mechanism 31, so that the specimen 2 can be disposed with the first axis A1 located on the second surface 3b of the specimen 2.

Consequently, as illustrated in FIGS. 25 and 26, the specimen 2 is disposed, with the second surface 3b of the specimen 2 being faced upward and the first surface 3a of the specimen 2 being faced downward. The second surface 3b of the specimen 2 is located on the first axis A1.

3.2.2. Specimen Machining Method (1) Machining of First Surface

First, as illustrated in FIGS. 23 and 24, the specimen 2, the first shield 34a, and the second shield 34b are set on the specimen holder 30. At this point, the specimen 2 is set, with the first surface 3a of the specimen 2 being located on the first axis A1 of the specimen holder 30.

The specimen holder 30 is then attached to the specimen stage 40. The specimen holder 30 is attached while a specimen-stage drawing mechanism 12 is opened. Subsequently, the position of the specimen 2, the position of the first shield 34a, and the position of the second shield 34b are adjusted by using a positioning camera 60.

A center distance D is then calculated according to a desired machining width by using Formula (1). Thereafter, the position of the specimen holder 30 is adjusted by using a slide mechanism 50 such that the center distance D has a calculated value.

Machining is then started. Specifically, a vacuum chamber 10 is first evacuated with the specimen-stage drawing mechanism 12 closed, so that the vacuum chamber 10 is placed in a vacuum. The specimen 2 is irradiated with the ion beam IB via the first shield 34a while moving the specimen 2 by the swing of the specimen holder 30 and the swing of the specimen stage 40.

Through these steps, a cross section of the specimen 2 can be machined from the first surface 3a.

(2) Machining of Second Surface

The specimen holder 30 is then rotated 180°. Thus, as illustrated in FIGS. 25 and 26, the specimen 2 can be disposed, with the first surface 3a of the specimen 2 being faced downward and the second surface 3b of the specimen 2 being faced upward. Subsequently, the specimen 2 is moved in −Z direction according to the thickness of the specimen 2 by the slide mechanism 31, so that the second surface 3b is disposed on the first axis A1. The specimen 2 can be rotated and slid while the vacuum chamber 10 is closed.

Machining is then started. Specifically, the specimen 2 is irradiated with the ion beam IB via the second shield 34b while moving the specimen 2 by the swing of the specimen holder 30 and the swing of the specimen stage 40.

Through these steps, a cross section of the specimen 2 can be machined from the second surface 3b.

In the foregoing description, an example in which the machining width of the specimen 2 is changed by changing the center distance D (see "1.2.2. First Operation Example") was described as a specimen machining method. Alternatively, an example in which the machining width of the specimen 2 is changed by changing the tilt angle range of the specimen 2 (see "1.2.3. Second Operation Example") may be applied as the specimen machining method.

3.3. Effects

The specimen machining device 300 rotates the specimen holder 30 so as to switch a state of irradiation of the ion beam IB from the first surface 3a of the specimen 2 and a state of irradiation of the ion beam IB from the second surface 3b of the specimen 2. Hence, the specimen machining device 300 can machine the specimen 2 from both of the first surface 3a and the second surface 3b. This can efficiently prepare the specimen 2 with a less tilted machining section. Furthermore, the machining time can be reduced.

Figure 27:
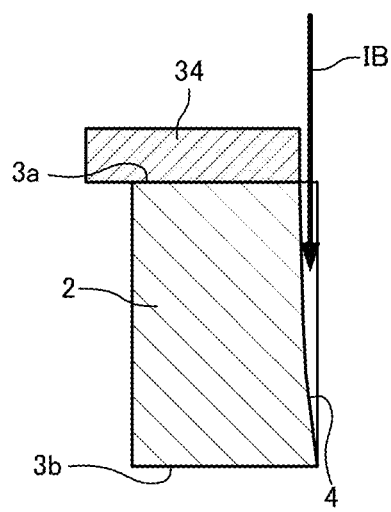
FIG. 27 schematically illustrates a specimen section when the specimen is machined only from a first surface.

FIG. 27 schematically illustrates a specimen section when the specimen 2 is machined only from the first surface 3a.

The machining rate of the specimen 2 decreases as the specimen 2 separates from an ion source 20. This is because the current density of the ion beam IB decreases as the ion beam IB separates from the ion source 20. Hence, if the specimen 2 is machined only from the first surface 3a, the machining rate decreases as machining proceeds from the first surface 3a to the second surface 3b. Thus, as illustrated in FIG. 27, a cross section 4 is tilted.

To address this problem, the specimen 2 is machined from both of the first surface 3a and the second surface 3b of the specimen 2, thereby reducing the tilt of the cross section 4. Furthermore, the specimen 2 can be machined with the ion beam IB having a high current density, thereby shortening the machining time.

The specimen machining device 300 can obtain the same effects as the specimen machining device 100.

3.4. Modifications

Modifications of the specimen machining device according to the third embodiment will be described below. Differences from the example of the specimen machining device 300 will be described below, and an explanation of similar points is omitted.

3.4.1. First Modification

In the foregoing embodiment, the specimen 2 is moved in −Z direction according to the thickness of the specimen 2 by the slide mechanism 31, so that the second surface 3b is disposed on the first axis A1. The configuration is not limited thereto.

Figure 28:
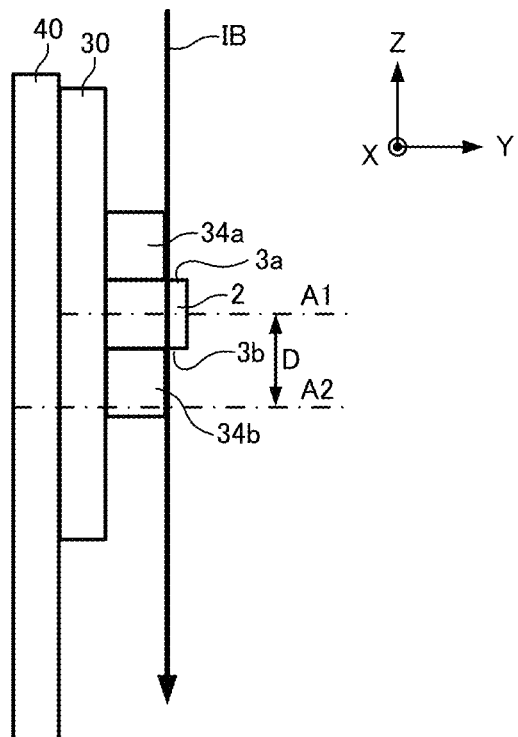
FIG. 28 schematically illustrates a specimen set on a specimen holder.
Figure 29:
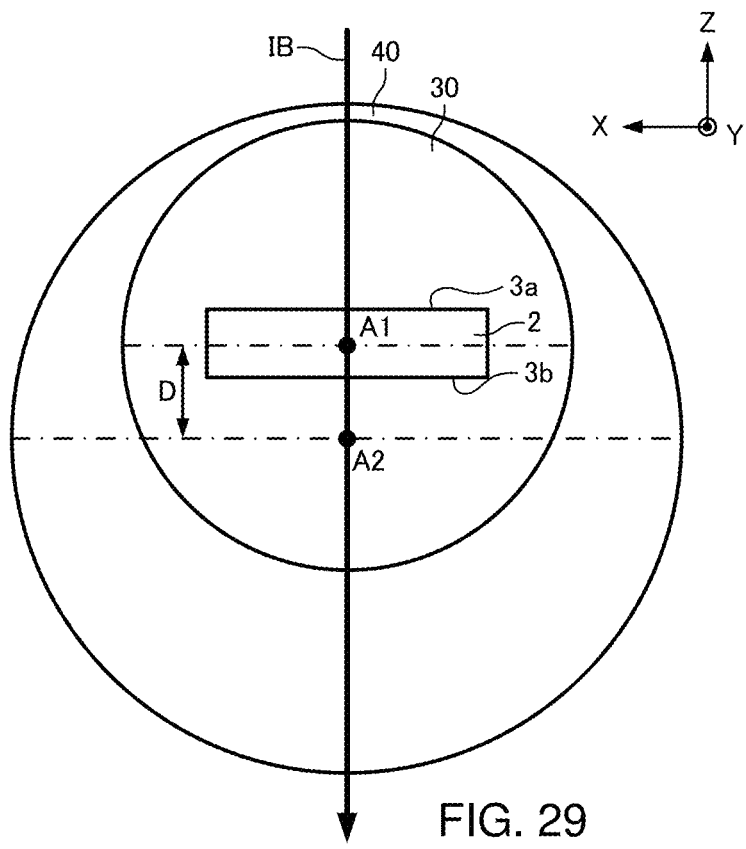
FIG. 29 schematically illustrates a specimen set on a specimen holder.

FIGS. 28 and 29 schematically illustrate the specimen 2 set on the specimen holder 30. FIG. 28 corresponds to FIG. 23, and FIG. 29 corresponds to FIG. 24.

As illustrated in FIGS. 28 and 29, the specimen 2 may be disposed such that the first axis A1 is located at the center of the specimen 2 in the thickness direction, that is, a position at equal distances from the first surface 3a and the second surface 3b. Thus, the specimen 2 can be machined from the first surface 3a of the specimen 2 and from the second surface 3b of the specimen 2 under the same conditions.

3.4.2. Second Modification

In the foregoing embodiment, the specimen holder 30 is rotated 180° so as to machine the specimen 2 from both of the first surface 3a and the second surface 3b. The specimen stage 40 may be rotated 180° so as to machine the specimen 2 from both of the first surface 3a and the second surface 3b.

3.4.3. Third Modification

The first modification, the second modification, the third modification, the fourth modification, and the fifth modification of the specimen machining device 100 according to the first embodiment are also applicable to the specimen machining device 300 according to the third embodiment.

4. Fourth Embodiment

4.1. Configuration of Specimen Machining Device

Figure 30:
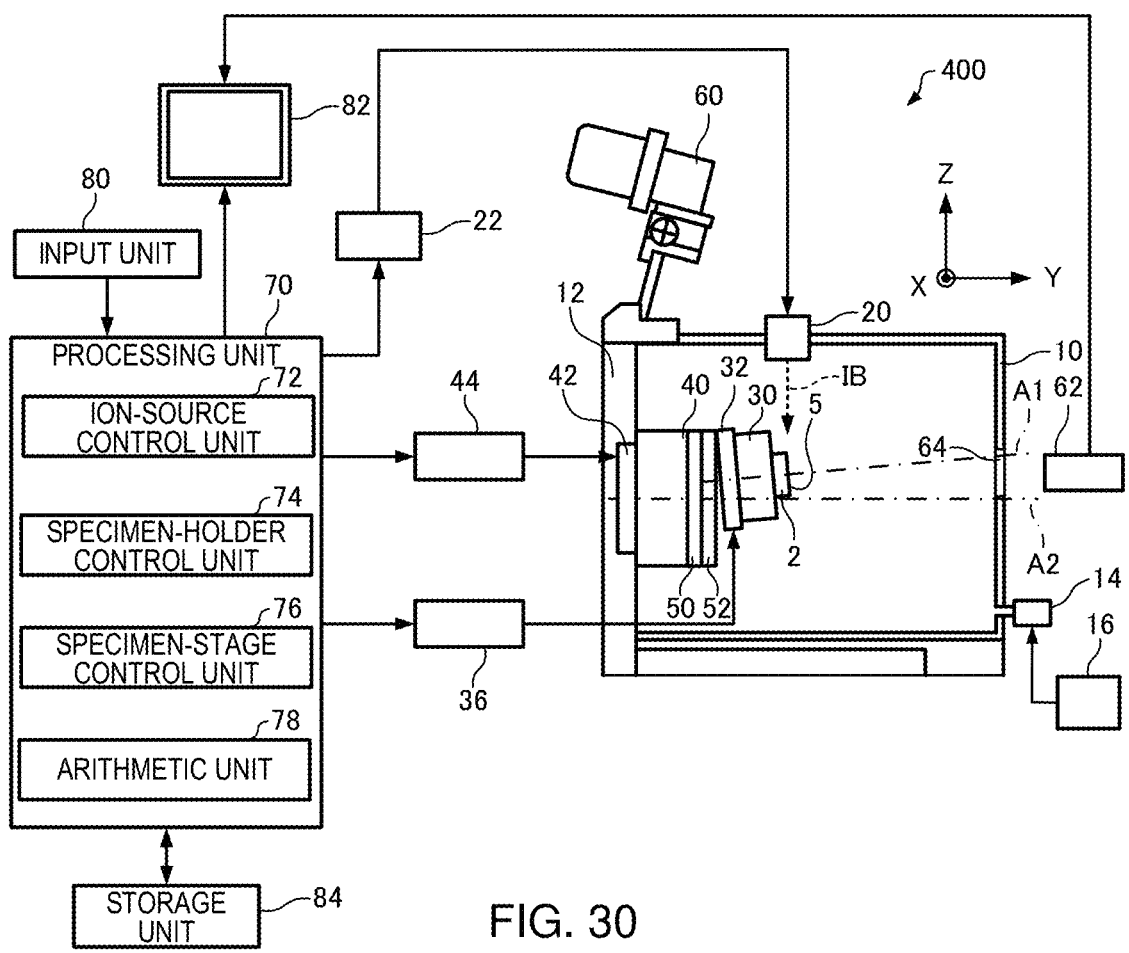
FIG. 30 illustrates a configuration of a specimen machining device according to the fourth embodiment.

A specimen machining device according to a fourth embodiment will be described below with reference to the accompanying drawings. FIG. 30 illustrates the configuration of a specimen machining device 400 according to the fourth embodiment. In the specimen machining device 400 according to the fourth embodiment, members having the same functions as the components of the specimen machining device 100 according to the first embodiment are indicated by the same reference numerals, and a detailed explanation thereof is omitted.

In the specimen machining device 100, the cross section of the specimen 2 is machined. In the specimen machining device 400, the surface of a specimen 2 can be machined.

The specimen machining device 400 includes a tilt mechanism 52 for tilting a surface 5 of the specimen 2 with respect to the optical axis of an ion beam IB.

The tilt mechanism 52 tilts a specimen holder 30 and a specimen-holder rotating mechanism 32. The specimen 2 can be tilted by tilting the specimen holder 30 via the tilt mechanism 52. The specimen 2 is disposed on the specimen holder 30 such that the ion beam IB has an incident angle of, for example, 5° or less with respect to the surface 5. The specimen machining device 400 does not include any shields.

4.2. Operation of Specimen Machining Device

Figure 31:
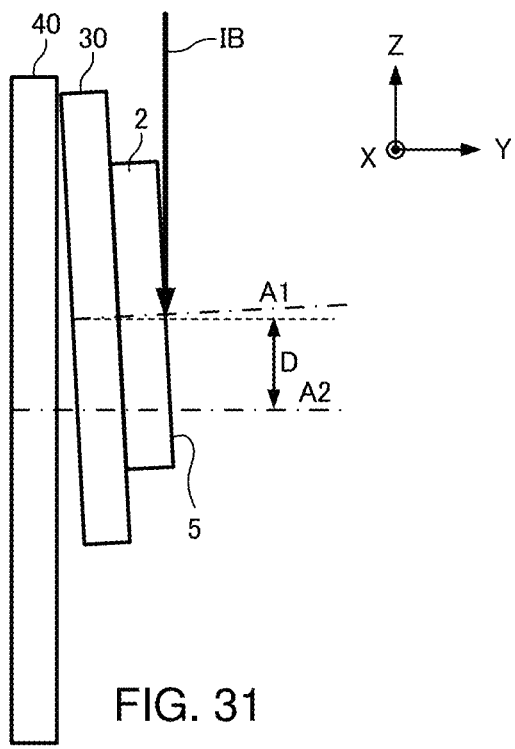
FIG. 31 schematically illustrates a specimen set on a specimen holder.
Figure 32:
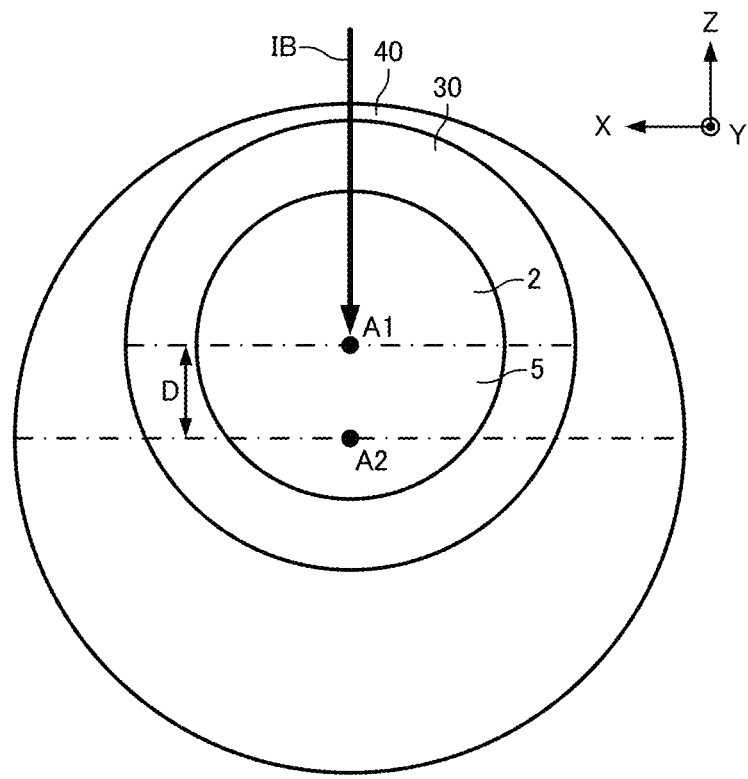
FIG. 32 schematically illustrates a specimen set on a specimen holder.

FIGS. 31 and 32 schematically illustrate the specimen 2 set on the specimen holder 30. FIG. 31 corresponds to FIG. 3, and FIG. 32 corresponds to FIG. 4.

As illustrated in FIG. 31, the specimen holder 30 is tilted with respect to the optical axis of the ion beam IB. Thus, the specimen 2 can be tilted with respect to the optical axis of the ion beam IB. The ion beam IB has an incident angle of, for example, 5° or less with respect to the surface 5 of the specimen 2. In this way, the specimen 2 is tilted with respect to the optical axis of the ion beam IB, so that the ion beam IB can be diagonally emitted to the surface 5 of the specimen 2. Hence, the surface of the specimen 2 can be machined. In the illustrated example, the specimen 2 is disposed with a first axis A1 located at the center of the specimen 2. Since the specimen holder 30 is tilted, the first axis A1 is tilted with respect to the Y axis.

Figure 33:
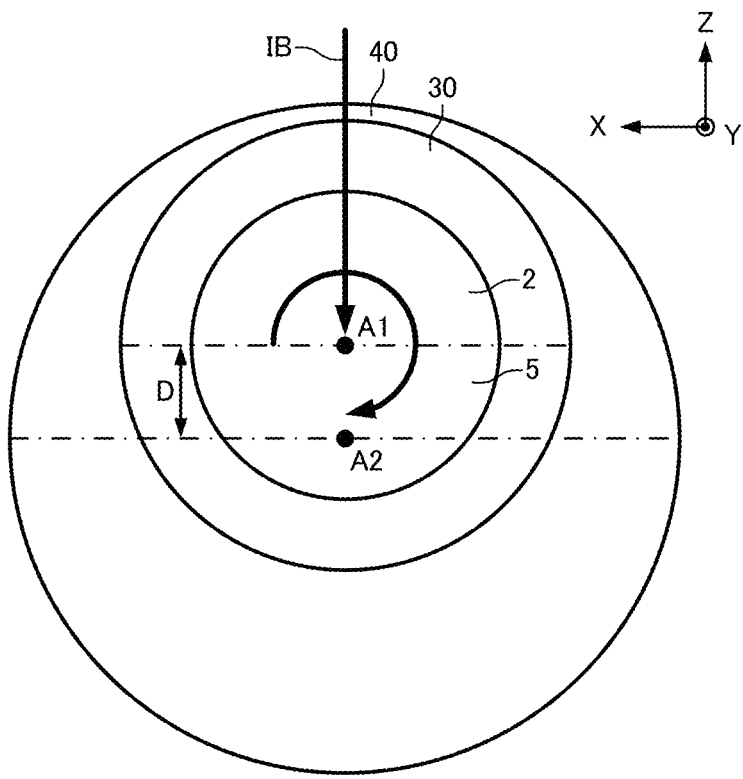
FIG. 33 illustrates an operation of a specimen machining device.
Figure 34:
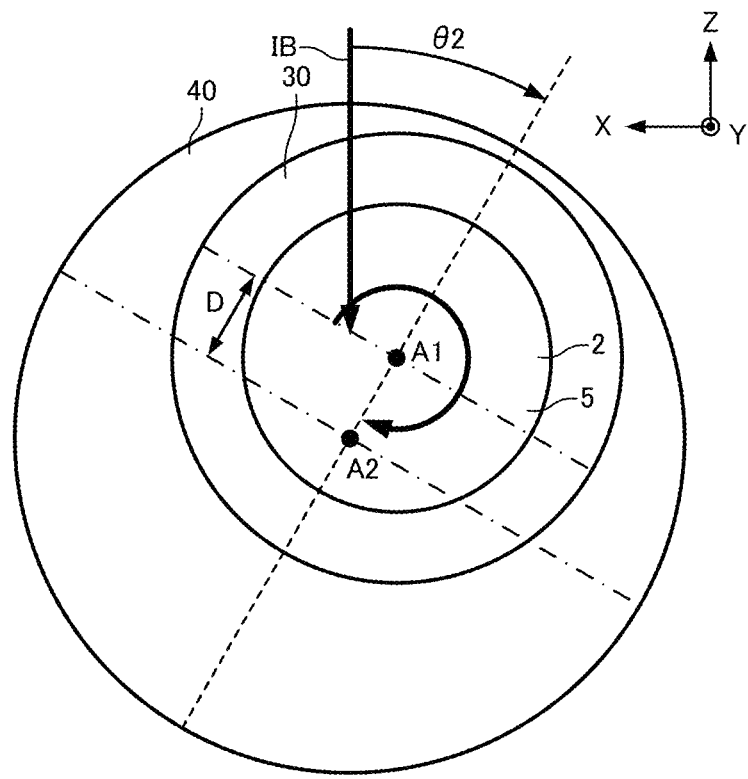
FIG. 34 illustrates an operation of a specimen machining device.
Figure 35:
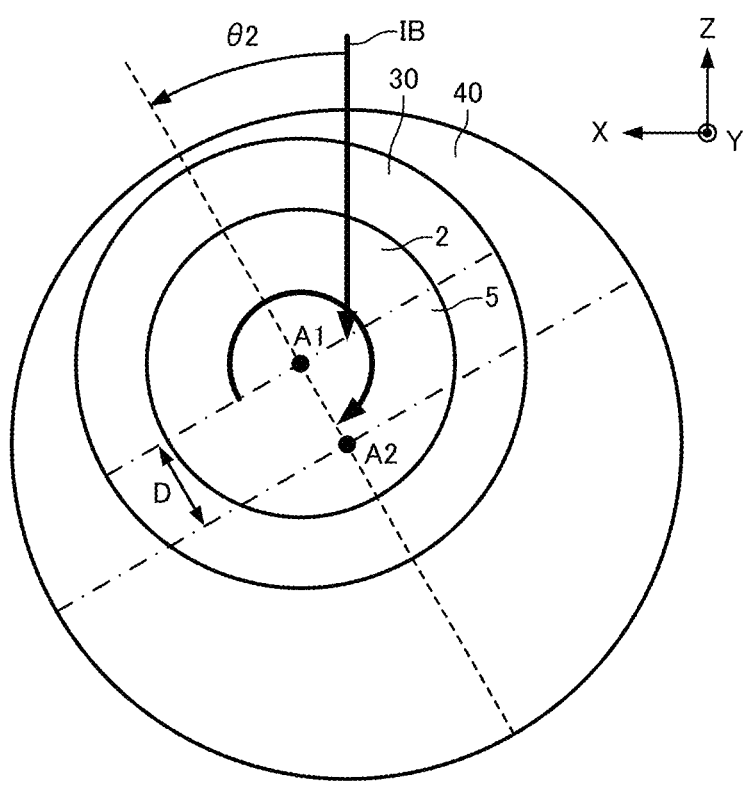
FIG. 35 illustrates an operation of a specimen machining device.

FIGS. 33 to 35 are explanatory drawings illustrating the operation of the specimen machining device 400. FIGS. 33 to 35 correspond to FIG. 32.

As illustrated in FIGS. 33 to 35, during machining in the specimen machining device 400, a specimen-holder control unit 74 operates the specimen-holder rotating mechanism 32 to rotate the specimen holder 30, and a specimen-stage control unit 76 operates a specimen-stage rotating mechanism 42 to swing a specimen stage 40.

The specimen holder 30 rotates in one direction about the first axis A1 serving as a rotation axis. In the illustrated example, the specimen holder 30 rotates clockwise. The rotation of the specimen holder 30 can reduce machining streaks on the machining surface.

The specimen stage 40 swings on a second axis A2 serving as a rotation axis. The specimen stage 40 swings in the range of, for example, ±30°. The swing of the specimen stage 40 can increase the machining range of the specimen 2.

In the specimen machining device 400, the machining range of the specimen 2 can be changed by changing a center distance D between the first axis A1 of the specimen holder 30 and the second axis A2 of the specimen stage 40 as in the specimen machining device 100.

Moreover, in the specimen machining device 400, as in the specimen machining device 100, the machining range of the specimen 2 can be changed by changing the range of a tilt angle r of the specimen 2 with respect to the optical axis of the ion beam IB by the rotation of the specimen holder 30 and the rotation of the specimen stage 40. In the specimen machining device 400, the tilt angle r of the specimen 2 is not changed by the rotation of the specimen holder 30, so that the tilt angle r of the specimen 2 is changed by the swing of the specimen stage 40.

In the specimen machining device 400, the tilt angle r increases with the range of the tilt angle θ2 of the specimen stage 40, thereby extending the machining range of the specimen 2.

4.3. Effects

The specimen machining device 400 includes the tilt mechanism 52 for tilting the surface 5 of the specimen 2 with respect to the optical axis of the ion beam IB. Hence, the specimen machining device 400 can machine the surface of the specimen 2.

Moreover, the specimen machining device 400 can obtain the same effects as the specimen machining device 100.

4.4. Modifications

Modifications of the specimen machining device according to the fourth embodiment will be described below. Differences from the example of the specimen machining device 400 will be described below, and an explanation of similar points is omitted.

4.4.1. First Modification

The specimen machining device 400 may include a shield 34 detachable from the specimen holder 30. The tilt mechanism 52 may switch a first state in which the first surface 3a of the specimen 2 and the optical axis of the ion beam IB form an angle of 90° as illustrated in FIG. 1 and a second state in which the surface 5 of the specimen 2 and the optical axis of the ion beam IB form an angle of 5° or less as illustrated in FIG. 30. Thus, the specimen machining device 400 can machine a cross section of the specimen 2 and the surface of the specimen 2.

4.4.2. Second Modification

Figure 36:
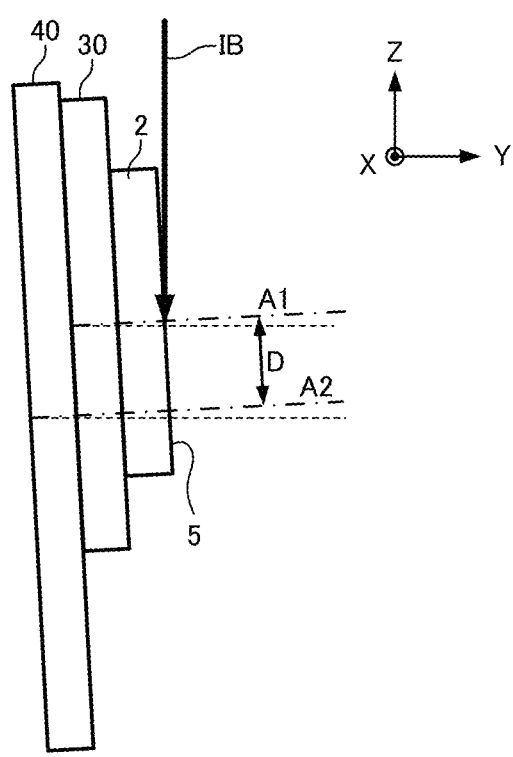
FIG. 36 illustrates an operation of a specimen machining device according to the second modification of the fourth embodiment.

FIG. 36 schematically illustrates the specimen 2 set on the specimen holder 30 in the specimen machining device according to a second modification. FIG. 36 corresponds to FIG. 31.

In the example illustrated in FIG. 31, the tilt mechanism 52 tilts the specimen holder 30, so that the specimen 2 is tilted. As illustrated in FIG. 36, the tilt mechanism may tilt the specimen stage 40 so as to tilt the specimen 2.

4.4.3. Third Modification

The fourth modification and the fifth modification of the specimen machining device 100 according to the first embodiment are also applicable to the specimen machining device 400 according to the fourth embodiment.

5. Fifth Embodiment

5.1. Configuration of Specimen Machining Device

Figure 37:
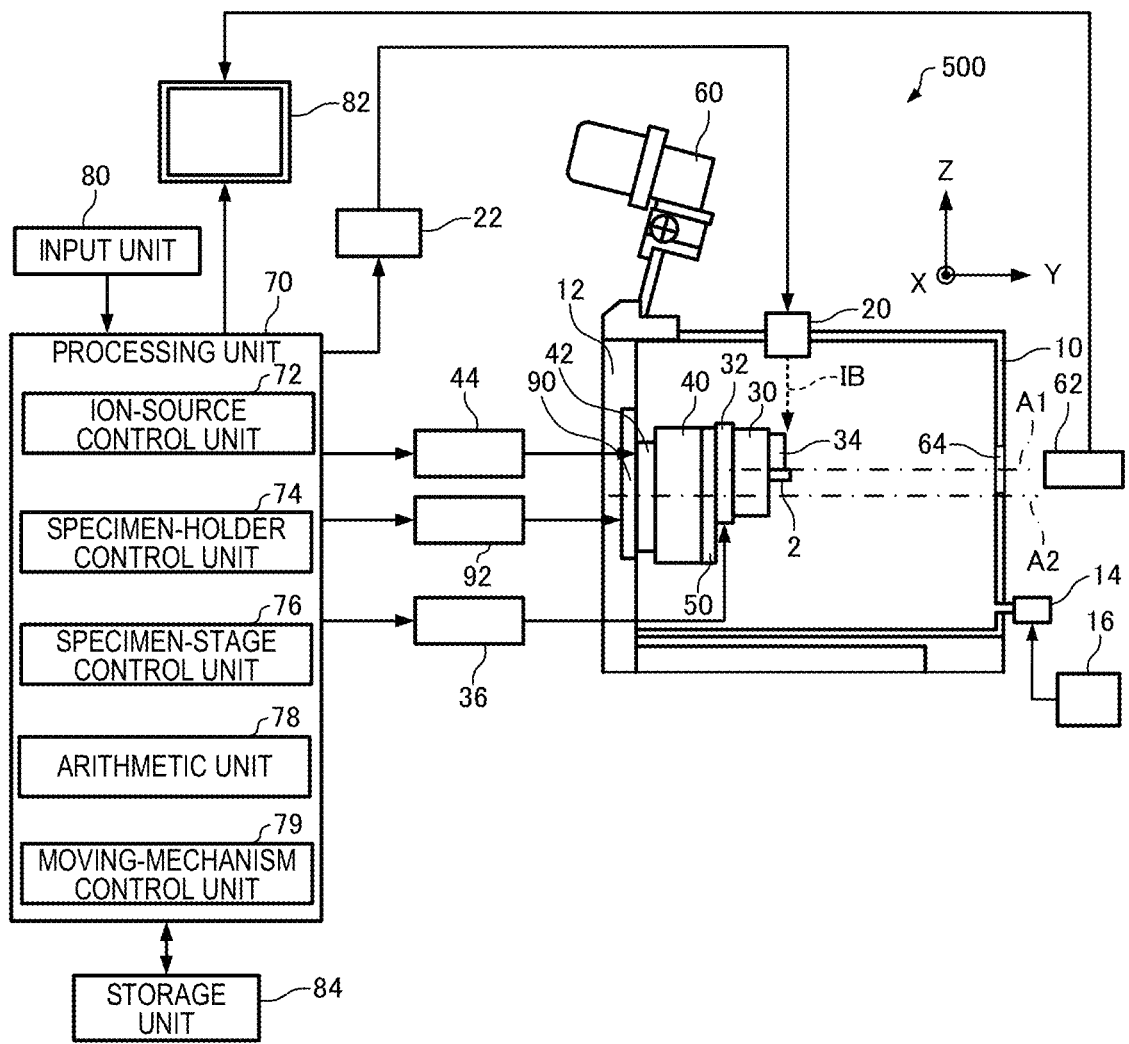
FIG. 37 illustrates a configuration of a specimen machining device according to the fifth embodiment.

A specimen machining device according to a fifth embodiment will be described below with reference to the accompanying drawings. FIG. 37 illustrates the configuration of a specimen machining device 500 according to the fifth embodiment. In the specimen machining device 500 according to the fifth embodiment, members having the same functions as the components of the specimen machining device 100 according to the first embodiment are indicated by the same reference numerals, and a detailed explanation thereof is omitted.

The specimen machining device 500 includes a moving mechanism 90 for moving a specimen stage 40 along the Z axis. A processing unit 70 includes a moving-mechanism control unit 79 for controlling the moving mechanism 90.

The moving mechanism 90 is disposed in a specimen-stage drawing mechanism 12. The specimen stage 40 is attached to the moving mechanism 90. For example, the moving mechanism 90 is an actuator that makes a linear motion by transmitting the torque of a motor to a drive mechanism. The moving mechanism 90 moves the specimen stage 40 along the Z axis, thereby moving a specimen holder 30 and a specimen 2 along the Z axis.

The moving-mechanism control unit 79 acquires a machining image of the specimen 2 from a machining observation camera 62 and acquires position information on an end of a machining region in the depth direction based on the machining image. The moving-mechanism control unit 79 causes the moving mechanism 90 to move the specimen stage 40 based on the position information. This can fix a distance between an ion source 20 and the position of the end of the machining region. Hence, the specimen 2 can be machined with a constant machining rate without reducing the machining rate.

5.2. Operation of Specimen Machining Device

In the specimen machining device 500, the specimen 2 is machined as in the specimen machining device 100. Specifically, in the specimen machining device 500, the specimen 2 is irradiated with the ion beam IB while moving the specimen 2 by the swing of the specimen holder 30 and the swing of the specimen stage 40.

Figure 38:
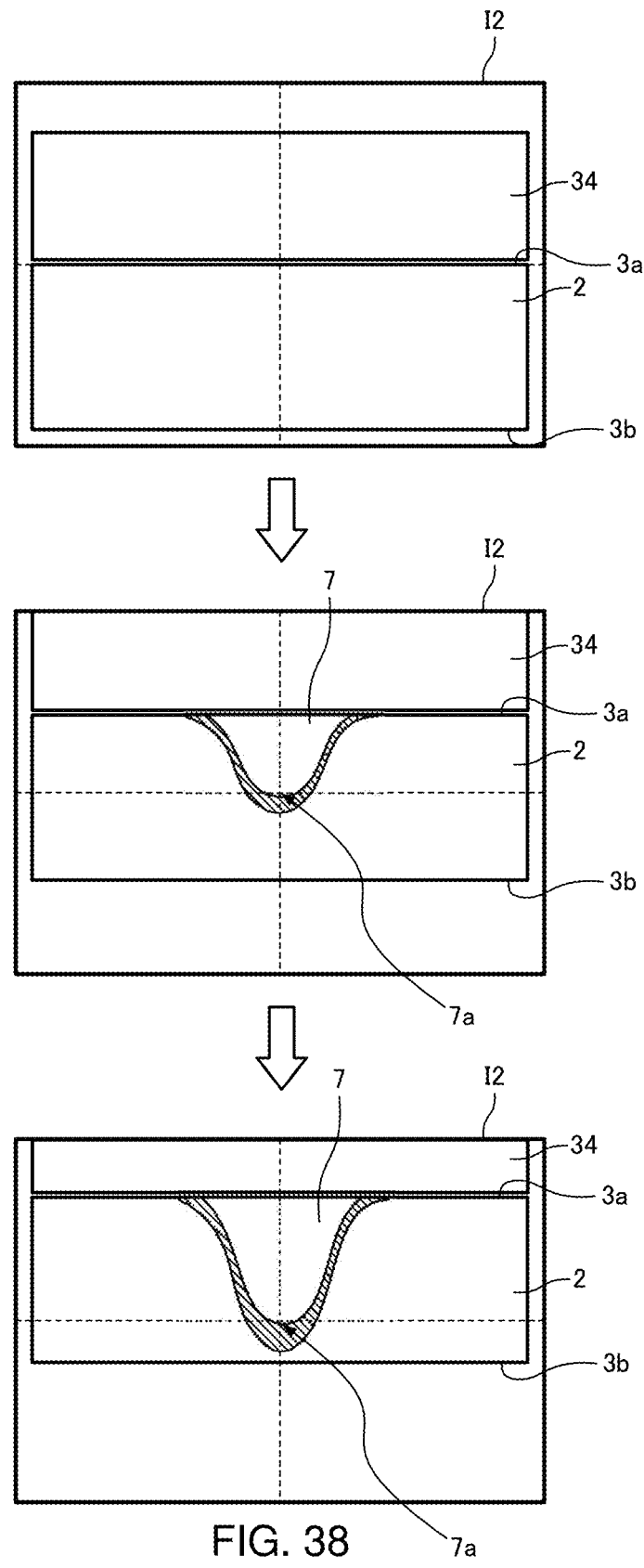
FIG. 38 schematically illustrates machining images acquired by a machining observation camera.

FIG. 38 schematically illustrates machining images 12 acquired by the machining observation camera 62. FIG. 38 illustrates the three machining images 12 at different elapsed times from the start of machining.

As illustrated in FIG. 38, at the start of machining, the specimen 2 has a first surface 3a at the center of the field of the machining image 12. As the specimen is machined, a machining region 7 extends such that an end 7a of the machining region 7 in the depth direction moves downward (−Z direction).

The moving-mechanism control unit 79 acquires the machining image 12 and specifies the position of the end 7a of the machining region 7 from the machining image 12. Subsequently, the moving-mechanism control unit 79 calculates the position of the specimen 2 so as to fix a distance between the ion source 20 and the end 7a and calculates the movement of the specimen 2. The moving-mechanism control unit 79 operates the moving mechanism 90 so as to move the specimen 2 according to the calculated movement. The moving-mechanism control unit 79 repeats this processing during machining, controlling the moving mechanism 90 so as to fix a distance between the ion source 20 and the end 7a.

5.3. Effects

The specimen machining device 500 includes the machining observation camera 62 for observing the machining region 7 of the specimen 2, the moving mechanism 90 for moving the specimen 2, and the moving-mechanism control unit 79 for controlling the moving mechanism 90 based on the machining image 12 acquired by the machining observation camera 62. Hence, the specimen machining device 500 can reduce a change of a distance between the ion source 20 and the end 7a. Thus, the specimen machining device 500 can prevent a machining rate from decreasing with the progress of machining.

5.4. Modifications

Modifications of the specimen machining device according to the fifth embodiment will be described below. Differences from the example of the specimen machining device 500 will be described below, and an explanation of similar points is omitted.

5.4.1. First Modification

In the foregoing embodiment, the moving-mechanism control unit 79 controls the moving mechanism 90 based on the machining image 12. The moving-mechanism control unit 79 may acquire information about an elapsed time from the start of machining and control the moving mechanism 90 based on the elapsed time. For example, the moving-mechanism control unit 79 may acquire information about the machining rate of the specimen 2 and determine the movement of the specimen 2 per unit time based on the information about the machining rate. This can reduce a change of a distance between the ion source 20 and the end 7a. The information about the machining rate may be inputted by a user via an input unit 80 or may be stored in advance in a storage unit 84.

5.4.2. Second Modification

The first modification, the second modification, the third modification, the fourth modification, and the fifth modification of the specimen machining device 100 according to the first embodiment are also applicable to the specimen machining device 500 according to the fifth embodiment.

The foregoing embodiments and modifications are merely exemplary, and the invention is not limited thereto. For example, the embodiments and modifications can be optionally combined.

The invention is not limited to the above-described embodiments, and various modifications can be made. For example, the invention includes configurations that are substantially the same as the configurations described in the embodiments. Substantially same configurations mean configurations having the same functions, methods and results, or configurations having the same objectives and effects as those of the configurations described in the embodiments, for example. The invention also includes configurations obtained by replacing non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

What is claimed is:

1. A specimen machining device comprising:
   an ion source which irradiates a specimen with an ion beam;
   a first rotating body that holds the specimen and is rotatable about a first axis serving as a rotation axis; and
   a second rotating body on which the first rotating body is disposed and which is rotatable about a second axis serving as a rotation axis different from the first axis, wherein
   the first axis and the second axis are parallel to each other,
   the specimen is moved by combining a first rotation of the specimen caused by rotation of the first rotating body with a second rotation of the specimen caused by rotation of the second rotating body, and
   the specimen which is being moved by a combination of the first and second rotations is irradiated with the ion beam.

2. The specimen machining device according to claim 1, wherein
   the specimen has a first surface and a second surface on an opposite side from the first surface,
   the specimen is irradiated with the ion beam from the side of the first surface,
   the first surface is disposed on the first axis,
   a distance between the first surface and the second axis is variable, and
   a machining range of the specimen is changed by changing the distance between the first surface and the second axis.

3. The specimen machining device according to claim 1, wherein
   the specimen has a first surface and a second surface on an opposite side from the first surface, the specimen is irradiated with the ion beam from the side of the first surface,
the first surface is disposed on the second axis,
a distance between the first surface and the first axis is variable, and
a machining range of the specimen is changed by changing the distance between the first surface and the first axis.

4. The specimen machining device according to claim 1, wherein
a distance between the first axis and the second axis is variable, and
a machining range of the specimen is changed by changing the distance between the first axis and the second axis.

5. The specimen machining device according to claim 2, further comprising:
an input unit that receives an input of information about the machining range of the specimen; and
an arithmetic unit that calculates the distance between the first axis and the second axis, based on the information about the machining range.

6. The specimen machining device according to claim 1, wherein a machining range of the specimen is changed by changing a range of a tilt angle of the specimen with respect to an optical axis of the ion beam by the rotation of the first rotating body and the rotation of the second rotating body.

7. The specimen machining device according to claim 6, further comprising:
an input unit that receives an input of information about the machining range of the specimen; and
an arithmetic unit that determines the range of the tilt angle of the specimen, based on the information about the machining range.

8. The specimen machining device according to claim 1, wherein a rotation speed of the first rotating body is different from a rotation speed of the second rotating body.

9. The specimen machining device according to claim 1, wherein a rotation speed of the first rotating body periodically changes.

10. The specimen machining device according to claim 1, wherein a rotation speed of the second rotating body periodically changes.

11. The specimen machining device according to claim 1, wherein
the first rotating body stops rotating for a predetermined time at each predetermined rotation angle, and
the second rotating body rotates at least one cycle in the predetermined time during which the first rotating body stops rotating.

12. The specimen machining device according to claim 1, wherein the first rotating body and the second rotating body swing.

13. The specimen machining device according to claim 1, further comprising a shield that is disposed on the specimen and partially blocks the ion beam,
wherein the specimen is irradiated with the ion beam through the shield.

14. The specimen machining device according to claim 13, wherein the shield is detachable.

15. The specimen machining device according to claim 1, wherein
the specimen has a first surface and a second surface on an opposite side from the first surface, and
a state in which the specimen is irradiated with the ion beam from the side of the first surface and a state in which the specimen is irradiated with the ion beam from the side of the second surface are switchable by rotating the second rotating body.

16. The specimen machining device according to claim 1, further comprising a tilt mechanism for tilting a surface of the specimen with respect to an optical axis of the ion beam.

17. The specimen machining device according to claim 1, further comprising:
a camera for observing a machining region of the specimen;
a moving mechanism for moving the specimen; and
a moving-mechanism control unit for controlling the moving mechanism, based on an image acquired by the camera.

18. The specimen machining device according to claim 1, further comprising:
a moving mechanism for moving the specimen; and
a moving-mechanism control unit that acquires information about an elapsed time from start of machining and controls the moving mechanism, based on the information on the elapsed time.

19. A specimen machining method in a specimen machining device that irradiates a specimen with an ion beam to machine the specimen, the method comprising:
irradiating the specimen with the ion beam while moving the specimen by a rotation of a first rotating body that holds the specimen and rotates about a first axis serving as a rotation axis and a rotation of a second rotating body on which the first rotating body is disposed and which rotates about a second axis serving as a rotation axis different from the first axis,
wherein
the first axis and the second axis are parallel to each other, and
the specimen is moved by combining a first rotation of the specimen caused by rotation of the first rotating body with a second rotation of the specimen caused by rotation of the second rotating body.

* * * * *